(12) United States Patent
Nakajima

(10) Patent No.: US 7,106,444 B2
(45) Date of Patent: Sep. 12, 2006

(54) POSITION MEASURING DEVICE, POSITION MEASUREMENT METHOD, EXPOSURE APPARATUS, EXPOSURE METHOD, AND SUPERPOSITION MEASURING DEVICE AND SUPERPOSITION MEASUREMENT METHOD

(75) Inventor: Shinichi Nakajima, Tokyo (JP)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 10/872,461

(22) Filed: Jun. 22, 2004

(65) Prior Publication Data

US 2004/0223157 A1    Nov. 11, 2004

Related U.S. Application Data

(63) Continuation of application No. 09/954,281, filed on Sep. 18, 2001, now abandoned, which is a continuation of application No. PCT/JP00/01760, filed on Mar. 23, 2000.

(30) Foreign Application Priority Data

Mar. 24, 1999   (JP) ................... 11-080559

(51) Int. Cl.
 *B01B 11/00*  (2006.01)
 *B01B 11/14*  (2006.01)
 *G06F 19/00*  (2006.01)
 *G06F 15/00*  (2006.01)
 *G01C 9/00*   (2006.01)
 *G01C 15/00*  (2006.01)
 *G01C 19/00*  (2006.01)

(52) U.S. Cl. ................ 356/401; 356/614; 700/125; 702/150

(58) Field of Classification Search ............... 356/614, 356/399–401; 250/548, 492.2, 559.01, 559.29, 250/559.3; 355/53, 55; 430/22, 30; 382/151; 700/121, 125; 702/94, 150
See application file for complete search history.

(56) References Cited

U.S. PATENT DOCUMENTS 4,531,060 A   7/1985   Suwa et al.
4,860,374 A   8/1989   Murakami et al.

(Continued)

FOREIGN PATENT DOCUMENTS

JP    U 60-130742    9/1985

(Continued)

*Primary Examiner*—Gregory J. Toatley, Jr.
*Assistant Examiner*—Gordon J. Stock, Jr.
(74) *Attorney, Agent, or Firm*—Oliff & Berridge PLC

(57) ABSTRACT

This position measuring device comprising a calculation unit 19 calculates mark position information relating to the position of the mark by using a mark signal obtained by irradiating a detection beam onto the mark formed on an object W, and a correction device 19 for correcting the calculation results from the calculation unit 19 based on the asymmetry of the mark signal.

As a result, positional deviation resulting from asymmetry can be detected, and by correcting for this deviation the effect that the image asymmetry has on the measurement can be reduced. Therefore, a more accurate high precision alignment can be performed, and there is no requirement to increase the NA of the detection optical system, nor to prepare a special short wavelength light source, meaning increases in the size and cost of the apparatus can also be prevented.

48 Claims, 17 Drawing Sheets

U.S. PATENT DOCUMENTS

| | | |
|---|---|---|
| 4,955,062 A | 9/1990 | Terui |
| 5,094,539 A | 3/1992 | Komoriya et al. |
| 5,109,430 A | 4/1992 | Nishihara et al. |
| 5,418,613 A | 5/1995 | Matsutani |
| 5,502,311 A | 3/1996 | Imai et al. |
| 5,525,808 A | 6/1996 | Irie et al. |
| 5,543,921 A * | 8/1996 | Uzawa et al. ............... 356/401 |
| 5,594,549 A | 1/1997 | Mori et al. |
| 6,023,338 A | 2/2000 | Bareket |
| 6,034,378 A | 3/2000 | Shiraishi |
| 6,242,754 B1 | 6/2001 | Shiraishi |
| 6,677,601 B1 | 1/2004 | Shiraishi |

FOREIGN PATENT DOCUMENTS

| | | |
|---|---|---|
| JP | A 61-208220 | 9/1986 |
| JP | A 61-215905 | 9/1986 |
| JP | A 63-298102 | 12/1988 |
| JP | A 1-227431 | 9/1989 |
| JP | A 1-243445 | 9/1989 |
| JP | A 2-7511 | 1/1990 |
| JP | A 2-105002 | 4/1990 |
| JP | A 2-119116 | 5/1990 |
| JP | A 2-192113 | 7/1990 |
| JP | A 3-270122 | 12/1991 |
| JP | U 4-65603 | 6/1992 |
| JP | A 4-186717 | 7/1992 |
| JP | A 7-167614 | 7/1995 |
| JP | A 2000-91204 | 3/2000 |
| KR | 130773 | 5/1990 |
| KR | 130778 | 6/1994 |

* cited by examiner

[MARK ASYMMETRY]

[OPTICAL SYSTEM ASYMMETRY (IMAGING APERTURE SHADING)]

POSITIONAL DEVIATION OF AN ASYMMETRIC IMAGE (EDGE MEASUREMENT)

LSA, FIA PROCESS 2

LSA, FIA PROCESS 3

LSA PROCESS

POSITION MEASURING DEVICE, POSITION MEASUREMENT METHOD, EXPOSURE APPARATUS, EXPOSURE METHOD, AND SUPERPOSITION MEASURING DEVICE AND SUPERPOSITION MEASUREMENT METHOD

This is a Continuation of application Ser. No. 09/954,281 filed Sep. 18, 2001 now abandoned, which in turn is a Continuation of PCT/JP00/01760, filed Mar. 23, 2000. The entire disclosures of the prior applications are hereby incorporated by reference herein in their entirety.

TECHNICAL FIELD

The present invention relates to an exposure apparatus and an exposure method for projection exposure of a photomask pattern image onto a photosensitive substrate, and a position measuring device and a position measurement method for measuring the exposure position and the drawing accuracy of the aforementioned photomask, as well as to a superposition measuring device and a superposition measurement method for measuring the superposition error of the exposed pattern, all within a manufacturing process for a semiconductor element or a liquid crystal display element or the like.

The present application is a continuation application of PCT/JP00/01760, and is based on Japanese Patent Application No. Hei 11-080559, the content of which is entirely incorporated herein by reference.

BACKGROUND ART

During the manufacture of semiconductor elements and liquid crystal display elements, a projection apparatus is used to project the image of a detailed pattern formed on a photomask or a reticle (hereafter referred to as a reticle) onto a photosensitive substrate (hereafter referred to as a wafer) such as a semiconductor wafer or a glass plate coated with a photosensitizer such as a photoresist. The reticle pattern is projected using an exposure apparatus such as a step and repeat system exposure apparatus, where the reticle and the wafer are positioned relatively with a high degree of precision (alignment), and the reticle pattern is then exposed so as to overlap the patterns already formed on the wafer. The requirements for this alignment process are becoming more and more stringent as patterns are miniaturized, and many schemes have been devised for the alignment process.

The most general method of reticle alignment utilizes an exposure light. Examples of this type of alignment system include the VRA (Visual Reticle Alignment) system wherein the exposure light is irradiated onto an alignment mark drawn on the reticle, and the mark position is measured by processing of the image data of the alignment mark captured by a CCD camera or the like.

Examples of wafer alignment systems include LSA (Laser Step Alignment) systems such as that disclosed in Japanese Unexamined Patent Application, First Publication No. Sho 60-130742 wherein laser light is irradiated onto a dotted line shaped alignment mark on the wafer, and the light diffracted or scattered by the mark is used for detecting the mark position, FIA (Field Image Alignment) systems such as that disclosed in Japanese Unexamined Patent Application, First Publication No. Hei 4-65603 wherein light of a broad wavelength band from a light source such as a halogen lamp is used for the illumination, and the mark position is then measured by image processing of the image data of the alignment mark captured by a CCD camera or the like, and LIA (Laser Interferometric Alignment) systems such as those disclosed in Japanese Unexamined Patent Application, First Publication No. Sho 61-208220 and Japanese Unexamined Patent Application, First Publication No. Sho 61-215905 wherein two coherent beams which are inclined relative to the pitch direction are irradiated onto a diffraction grid shaped alignment mark on the wafer, the two diffracted light beams undergo interference, and the phase of that interference is used for measuring the position of the alignment mark.

In these types of optical alignments, first the alignment mark on the reticle is detected, processed, and the position coordinates are measured. Next, the alignment mark on the wafer is detected, processed, and the position coordinates are measured to determine the position of the shot for registration. Based on these results, a wafer stage is used to move the wafer so that the reticle pattern image is superimposed on the shot position, and the reticle pattern image is then exposed.

However, the conventional position measuring devices, position measurement methods and exposure apparatus described above suffer from the problems described below.

Exposure apparatus are typically provided with the aforementioned plurality of different types of sensors as part of the alignment system, but in all such systems, the influence of the marks and optical aberrations mean that the image obtained is asymmetric, leading to positional deviation errors, and a deterioration in the alignment precision. An example of a method for reducing these positional deviation errors comprises conducting measurements by using a shorter period (high frequency) component of the image. In the LSA system and the FIA system, raising the NA value (numerical aperture) and shortening the wavelength corresponds with this measurement method. In the LIA system, detecting the phase of higher order diffracted light corresponds with this measurement method.

However, in these measurement methods, there are associated manufacturing limits. Furthermore, this method also suffers from a deterioration in the S/N ratio of the high frequency component, which incorporates surface roughness on the wafer as noise.

In terms of the aforementioned manufacturing limits, in the LSA system and the FIA system, positional deviation errors can be reduced if the NA of the detection optical system such as a lens is increased, but the NA cannot be increased indefinitely. The reason being that the greater the value of the NA, the larger the entire alignment device becomes. However, alignment devices using a LSA system or a FIA system are typically positioned inside the exposure apparatus in a confined space below the projection lens (in the vicinity of the wafer stage), and so the alignment device cannot be increased in size indefinitely.

Furthermore, in the LSA system and the FIA system it is already proven that the positional deviation error can be reduced by shortening the wavelength of the detecting light. Shortening the wavelength can be achieved by, for example, using a light source which emits a shorter wavelength light, but there is a restriction in that light of a wavelength which will expose the wafer (exposure light) cannot be used. Furthermore, from a technical viewpoint, it is not currently possible to use all light sources which emit a short wavelength, and there are limits on the numbers of short wavelength light sources which can be practically applied as the alignment light source.

Moreover in the LIA system, it is already proven that positional deviation errors can be reduced by detecting the phase of higher order diffracted light. This detection of higher order diffracted light is closely related to the NA of the detection optical system. As the order of diffracted light increases, the emission (reflection) off the alignment mark becomes increasingly broad. In order to detect this very broad band of high order diffracted light, a detection optical system with a large NA must be used. However as described above, the NA value cannot be increased indefinitely. Consequently, the order of diffracted light which can be detected is also necessarily limited.

Furthermore, the problems described above also arise in the case of superposition measuring devices for measuring the superposition error of exposed patterns across a plurality of layers on a wafer surface.

DISCLOSURE OF THE INVENTION

The present invention takes the above factors into consideration, with an object of providing a position measuring device and a position measurement method capable of reducing the positional deviation error of a mark and enabling high precision alignment, without requiring an increase in the size of the device, even if the alignment mark image is asymmetric, as well as an exposure apparatus and an exposure method capable of high precision exposure processing using the measured mark and the position measurement method. Furthermore, another object of the present invention is to provide a superposition measuring device and a superposition measurement method for measuring, with a high degree of precision, the superposition error between a plurality of marks formed on individual layers an a substrate.

In order to achieve the above objects, the present invention employs the construction described below, which is further described by the embodiments shown in FIG. 1 through FIG. 20F.

A position measuring device of the present invention is a position measuring device comprising a calculation unit (19) which calculates information relating to the position of the mark by using a mark signal obtained by irradiating a detection beam onto a mark formed on an object (W), wherein the device further comprises a correction device (19) which corrects the calculation results from the calculation unit (19) based on the asymmetry of the mark signal.

Furthermore, a position measurement method of the present invention is a position measurement method which calculates information relating to the position of the mark by using a mark signal obtained by irradiating a detection beam onto the mark formed on an object (W), wherein the calculation results are corrected based on the asymmetry of the mark signal.

As described above, the use of a high frequency component for improving precision refers to the fact that the measurement results differ depending on whether or not the high frequency component is ignored, and this difference in measurement results can be used as an indicator of the asymmetry of the image. Furthermore, the amount of positional deviation in those cases where asymmetry exists is often dependent on the frequency configuration of the original image. FIG. 4 is a simulation diagram for a mark with a particular structure, showing the image in the case where the mark is asymmetric (shown in FIG. 2) and the case where asymmetry has been introduced into the optical system by shifting the imaging aperture of the optical system (see FIG. 3), with the measured values of the positional deviation of the asymmetric image being plotted for different degrees of high frequency removal. In the example shown, edge measurements (described below) were used. The horizontal axis in FIG. 4 represents the degree of high frequency removal, and is termed the low pass index in this specification. The smaller this low pass index becomes, the greater the proportion (degree) of the high frequency component being removed becomes.

FIG. 4 shows the results for the case where filtering was performed using a SYNC function, with the cutoff set at a value of ½ of the sampling frequency multiplied by the low pass index. This figure reveals that, although the direction of the asymmetry is opposite, the amount of positional deviation is substantially equal regardless of the cause of the asymmetry. Furthermore, FIG. 4 also shows the amount of positional deviation for those cases where the asymmetry is increased to 1.5 fold. At all values of the low pass index, the amount of positional deviation also increased 1.5 fold, displaying a linear relationship. Consequently, the amount of positional deviation can be used as an indicator of the asymmetry.

A position measuring device and a position measurement method of the present invention utilize this property, and by determining the degree of asymmetry as a difference between a plurality of measurement values at each frequency component, and then performing a correction by subtracting, from the measured value, this difference multiplied by a coefficient, the influence of the asymmetry of the image on the measurements can be reduced. For example, in the image shown in FIG. 4, by using the result from the calculation (result at low pass index 1.0)−{(result at low pass index 0.2)−(result at low pass index 1.0)}×(coefficient) as the final measurement result for the mark position, the amount of positional deviation in the measurement result due to asymmetry can be effectively reduced to zero.

Furthermore in a similar manner, in a template matching method, two or more templates of differing frequency configurations are prepared in advance, and position measurements are then performed using each template. FIG. 5 is a diagram showing variations in the positional deviation of an asymmetric image in the case where a template matching method is applied. As shown in the figure, when the frequency component of the template is low, the high frequency component of the image can be ignored, and the same effects can be achieved as the case described above, where filtering or the like is used to remove high frequencies.

In addition, observation of different frequency components is also possible by calculating the phase of two or more Fourier components for an image, and then determining the calculated position of the mark from each phase. When calculating a position from a high frequency component, positional deviations greater than the period of that particular component cannot be detected, and so lower frequency components can be used, as necessary, for rough positioning. Subsequently, the difference between the result from (a calculated value including) a high frequency component and the result for the low frequency component can be used as an indicator of the positional deviation due to asymmetry.

In contrast, a method using Fourier transformations represents the same operations as the case where each component of diffracted light from an optical system is detected individually. This method can, of course, also be applied to an LIA system in which the phase of a plurality of diffracted light beams are detected directly. FIG. 6 is a diagram showing the positional deviation of an asymmetric image in a LIA system for each order of diffracted light. As can be seen in this figure, when measurements are performed with diffracted light of higher orders, the phase of diffracted light of lower orders can be used as necessary, in the same manner as for the case of Fourier transformations, although finally the difference between the result incorporating values up to high order diffracted light and the result incorporating values up to a lower order diffracted light acts as an indicator of the positional deviation resulting from asymmetry.

Furthermore, an exposure apparatus of the present invention is an exposure apparatus (1) for aligning a mask (R) and a substrate (W) by using a mask mark on the mask (R) and a substrate mark on the substrate (W), and then exposing a pattern from the mask (R) onto the substrate (W), wherein a position measuring device (16, 17, 19) according to any one of the first through fifth aspects, the seventh through tenth aspects, the twelfth through seventeenth aspects, the nineteenth through twenty fourth aspects, and the twenty sixth through twenty eighth aspects of the invention is provided as a position measuring device which measures the position of at least one of the mask mark and the substrate mark.

In addition, an exposure method of the present invention is an exposure method of aligning a mask (R) and a substrate (W) by using a mask mark on the mask (R) and a substrate mark on the substrate (W), and then exposing a pattern from the mask (R) onto the substrate (W), wherein a position measuring method according to any one of the thirty second through thirty seventh aspects, the thirty ninth through forty third aspects, the forty fifth through fiftieth aspects, and the fifty second through fifty third aspects of the invention is used as a position measuring method for measuring the position of at least one of the mask mark and the substrate mark.

Consequently, in an exposure apparatus and an exposure method according to the present invention, when the position of at least one of the mask mark and the substrate mark is measured, the mark functions as a measurement target for the position measuring device (16, 17, 19), and the effect of the asymmetry of the mark image on the measurement can be reduced.

A superposition measuring device of the present invention is a superposition measuring device which measures the superposition error between a plurality of measurement targets comprising a plurality of marks formed on individual layers on a substrate (W), wherein a position measuring device (16, 17, 19) according to any one of the first through fifth aspects, the seventh through tenth aspects, the twelfth through seventeenth aspects, the nineteenth through twenty fourth aspects, and the twenty sixth through twenty eighth aspects of the invention is provided as a position measuring device which measures the positions of the measurement targets.

In addition, a superposition measurement method of the present invention is a superposition measurement method for measuring the superposition error between a plurality of measurement targets comprising a plurality of marks formed on individual layers on a substrate (W), wherein a position measurement method according to any one of the thirty second through thirty seventh aspects, the thirty ninth through forty third aspects, the forty fifth through fiftieth aspects, and the fifty second through fifty third aspects of the invention is used as a position measurement method for measuring a mark position.

Consequently, in a superposition measuring device and a superposition measurement method according to the present invention, when the superposition error is measured for a plurality of marks comprising a plurality of measurement targets formed on individual layers on a substrate (W), the effect of the asymmetry of a mark image on the measurement can be reduced.

BEST MODE FOR CARRYING OUT THE INVENTION

As follows is a description of embodiments of a position measuring device, a position measurement method, an exposure apparatus, and an exposure method of the present invention, with reference to FIG. 1 through FIG. 20F.

Figure 1:
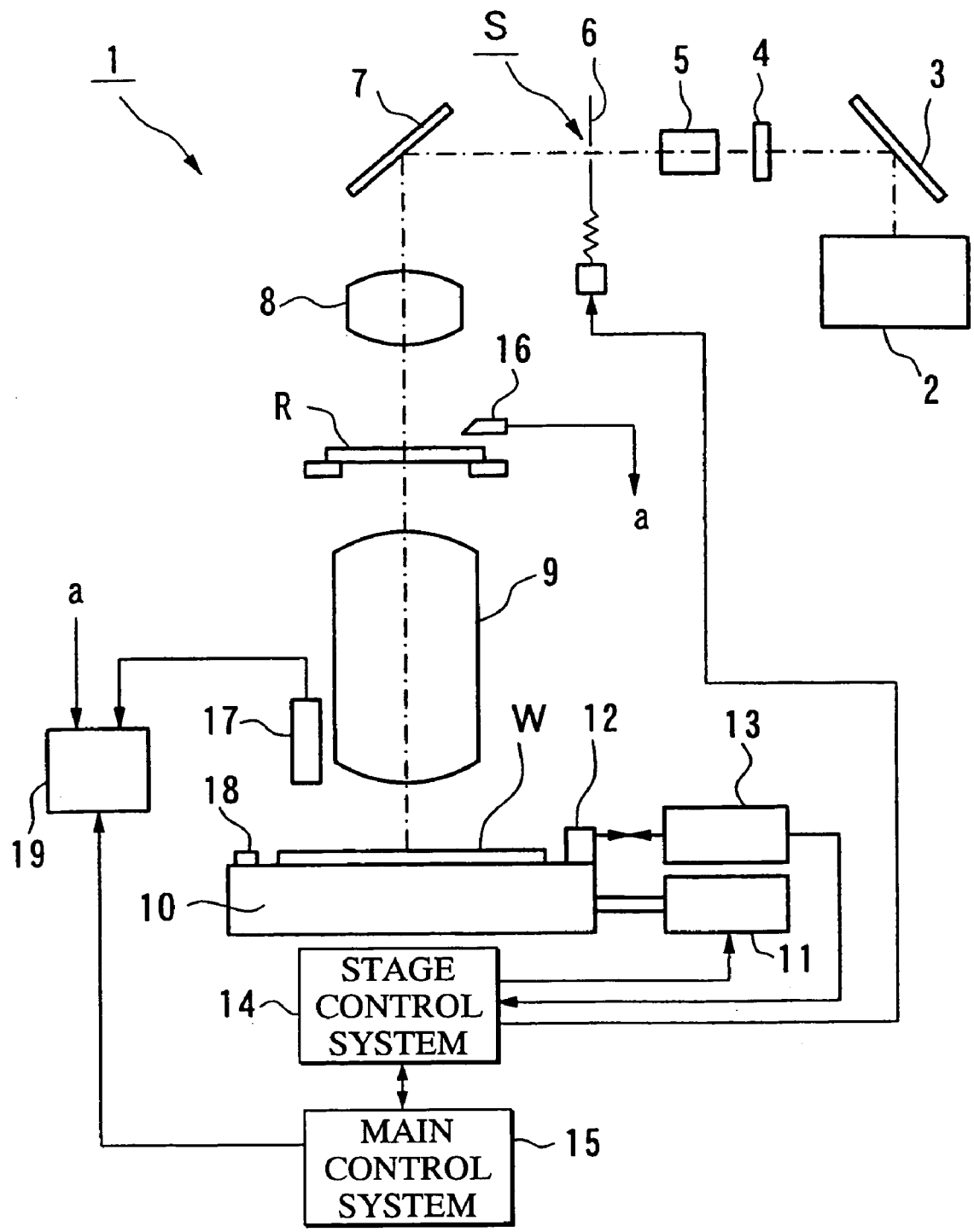
FIG. 1 is a diagram showing an embodiment of the present invention, and represents a schematic structural diagram of an exposure apparatus.
Figure 2:
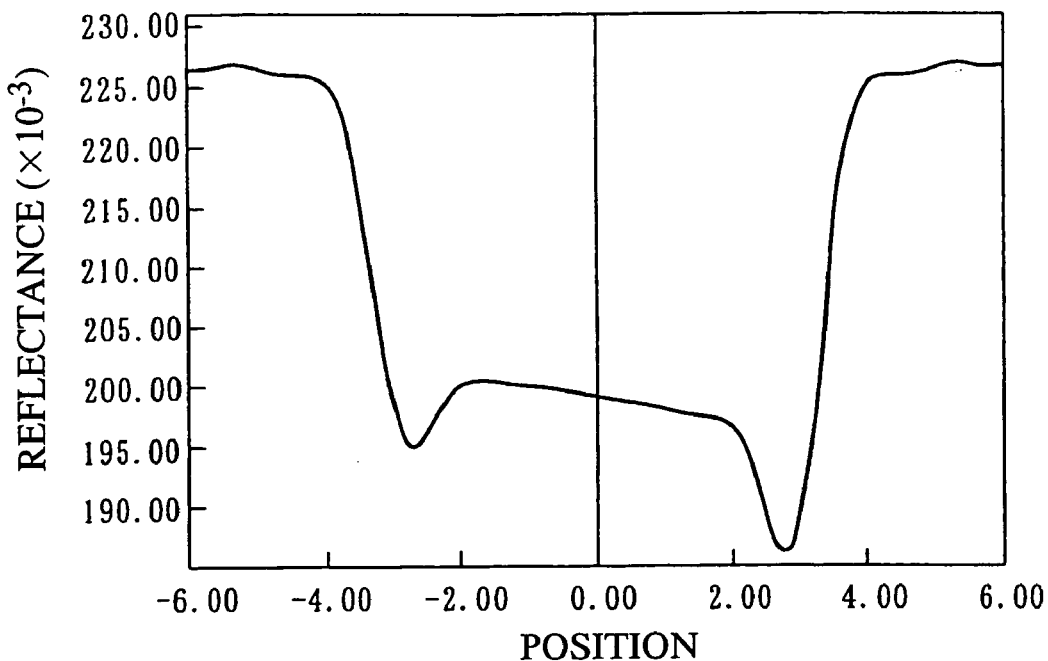
FIG. 2 is a relational diagram showing the relationship between the position of an asymmetric image arising from mark asymmetry and the reflectance.
Figure 3:
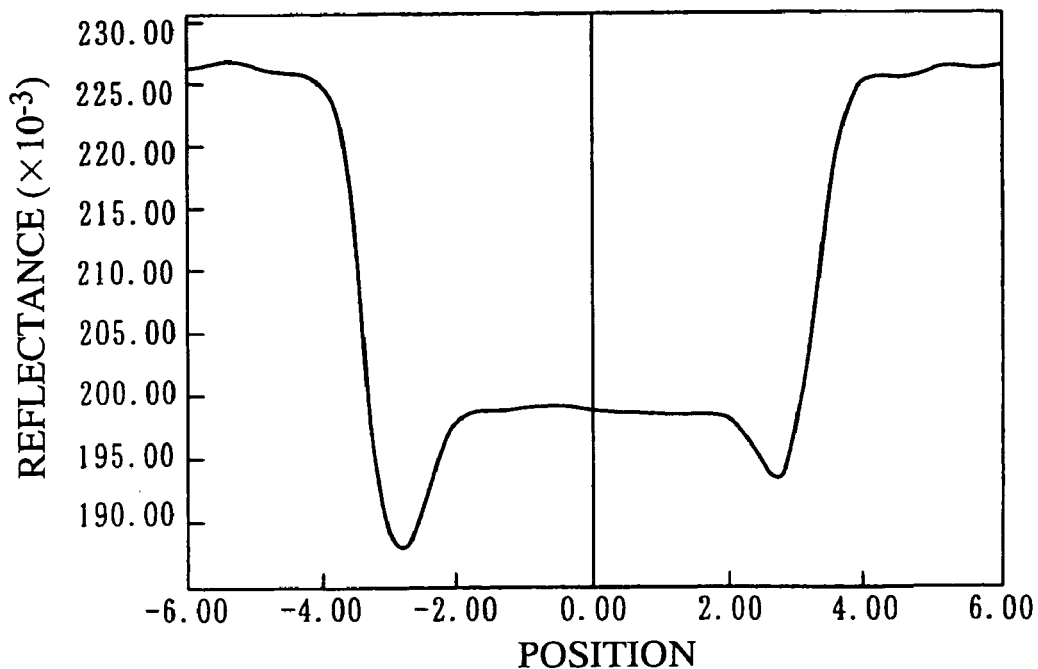
FIG. 3 is a relational diagram showing the relationship between the position of an asymmetric image arising from optical system asymmetry and the reflectance.

FIG. 1 is a schematic structural diagram of an exposure apparatus 1 of the present invention. Illuminating light emitted from a light source 2 such as an extra high pressure mercury lamp or a excimer laser is reflected off a reflective mirror 3 and enters a wavelength selecting filter 4 which transmits only light of the wavelength necessary for the exposure light beam. Having passed through the wavelength selecting filter 4, the illuminating light is adjusted by a fly eye integrator 5 to produce a light beam with a uniform intensity distribution, which then reaches a reticle blind 6. The reticle blind 6 is a device for altering the size of the aperture S, thereby setting the illumination area of the reticle (mask) R exposed to the illuminating light beam.

The illuminating light which passes through the aperture S of the reticle blind 6 is reflected by a reflective mirror 7 and enters a lens system 8. This lens system 8 causes an image of the aperture S of the reticle blind 6 to be imaged onto the reticle R, illuminating the desired area of the reticle R. The wavelength selecting filter 4, the fly eye integrator 5, the reticle blind 6 and the lens system 8 comprise the illumination optical system. An image of a shot pattern or alignment mark (the measurement target) in the illuminated area of the reticle R is imaged onto a wafer (substrate, object) W coated with a resist using a projection optical system 9. As a result, the pattern image of the reticle R is exposed onto a specified area on the wafer W.

The wafer W is retained on top of a wafer stage 10 by vacuum attachment. The wafer stage 10 has a structure comprising a pair of overlapping blocks which are perpendicular to the optical axis of the projection optical system 9 and which can be moved in mutually orthogonal directions. Furthermore, by driving the wafer stage 10 with a drive device 11 such as a motor, the position of the wafer stage 10 within the stage movement coordinate system, namely the shot position on the wafer W which overlaps with the exposure field of view of the projection optical system 9, can be adjusted.

The position of the wafer stage 10 within the stage movement coordinate system is detected by a laser interferometer 13 which irradiates a laser beam at a movable mirror 12 fixed to the wafer stage 10. The measurement value from the laser interferometer 13 is output to a stage control system 14. Based on this information, the stage control system 14 controls the stage drive device 11. Furthermore, the measurement value information from the laser interferometer 13 is also output from the stage control system 14 to a main control system 15. The main control system 15 controls the stage control system 14 based on this output information.

The exposure apparatus 1 is provided with, for example, a TTR (through the reticle) system reticle alignment sensor 16, and an off axis system wafer alignment sensor 17, which are used for aligning the reticle R and the wafer W. Although omitted from the figure, a so-called TTL (through the lens) system alignment sensor could also be provided, wherein light from the alignment mark formed on the wafer W is acquired via the projection optical system 9 (without passing through the reticle R), and position information about the mark is then determined. In terms of suitable alignment methods for use with the TTR system alignment sensor 16 or the TTL system alignment sensor, LSA systems and LIA systems utilizing a He—Ne laser or the like, or exposure light alignment systems utilizing the exposure light are preferred.

Particularly in those cases where a projection optical system 9 for a KrF (krypton fluoride) or a ArF (argon fluoride) excimer laser is used, because the wavelength of the He—Ne laser and the wavelength of the KrF or ArF excimer laser are very different, the chromatic aberration relationship of the projection optical system 9 means that exposure light alignment systems are preferable. Furthermore, if an exposure light alignment system is used then offsets need not be considered, and the so-called base line need not be controlled.

The reticle alignment sensor 16 measures the positional relationship (amount of deviation) between the alignment mark formed on the reticle R and the wafer W or a reference mark on a reference mark member 18, which is observed via the projection optical system 9. In an exposure light alignment system, this positional relationship can be viewed directly by using an imaging element (CCD) to present a display on a monitor. The reference mark member 18 is fixed to the wafer stage 10 and comprises a mark formed at the same height as the surface of the wafer W. By measuring this mark, the reference positions of both of the aforementioned alignment sensors 16, 17 can be determined.

In terms of an alignment system for the off axis system alignment sensor 17, a FIA system, a LSA system, a LIA system, or an exposure light alignment system using the exposure light can be used. In the case of a LSA systems or a LIA system, a photoelectric transfer element such as a SPD is used for the wafer alignment sensor 17, whereas in the case of a FIA system, an imaging element such as a CCD is used.

The output signals from the reticle alignment sensor 16 and the wafer alignment sensor 17 are processed by an alignment control system (calculation unit, correction device) 19. The reticle alignment sensor 16, the wafer alignment sensor 17, and the alignment control system 19 comprise the position measuring device of the present invention. The alignment control system 19 is controlled by the main control system 15.

During an alignment using a position measuring device and an exposure apparatus of the aforementioned construction, an alignment light beam (a detection beam) is irradiated onto a measurement target (an alignment mark), and by detecting the signal from this measurement target using either one of the alignment sensors 16, 17, the position of the alignment mark (measurement target) formed on the wafer W is detected, and based on that detection result, those patterns formed in previous processes and the pattern on the reticle R are aligned correctly within the shot area of the wafer W. The stage control system 14 receives the alignment result from the main control system 15, and controls the stage drive device 11 based on that result, moving the wafer W to a predetermined position. The shot pattern in the illuminated area of the reticle R is then exposed, via the projection optical system 9, onto a specific area of the wafer W.

Next is a detailed description of the alignment processing.

[Alignment Process 1 in the Case of a LSA System or a FIA System]

As follows is a description of the operation of the alignment control system 19 in a LSA alignment system or a FIA alignment system, based on the flowchart of FIG. 7.

First, at step S1, a signal (for example, an image signal with a certain intensity value, a waveform signal corresponding with an image signal, or a signal arising from preliminary processing of a mark signal) relating to a mark detected by the reticle alignment sensor 16 or the wafer alignment sensor 17 is acquired. Next, at step S2, the mark position of the acquired signal is measured at a plurality of low pass index values, using an edge measurement method for example (mark position measurement 1 through to mark position measurement n). The measurement method used for measuring the mark position at the plurality of low pass index values is not restricted to an edge measurement method, and the position measurements could also be performed by using a correlation method (such as a template matching method or an autocorrelation method) as described below for example. As shown in FIG. 7, the mark position measurements at a plurality of low pass index values are performed in parallel, by individual processes corresponding with each index value.

Figure 8:
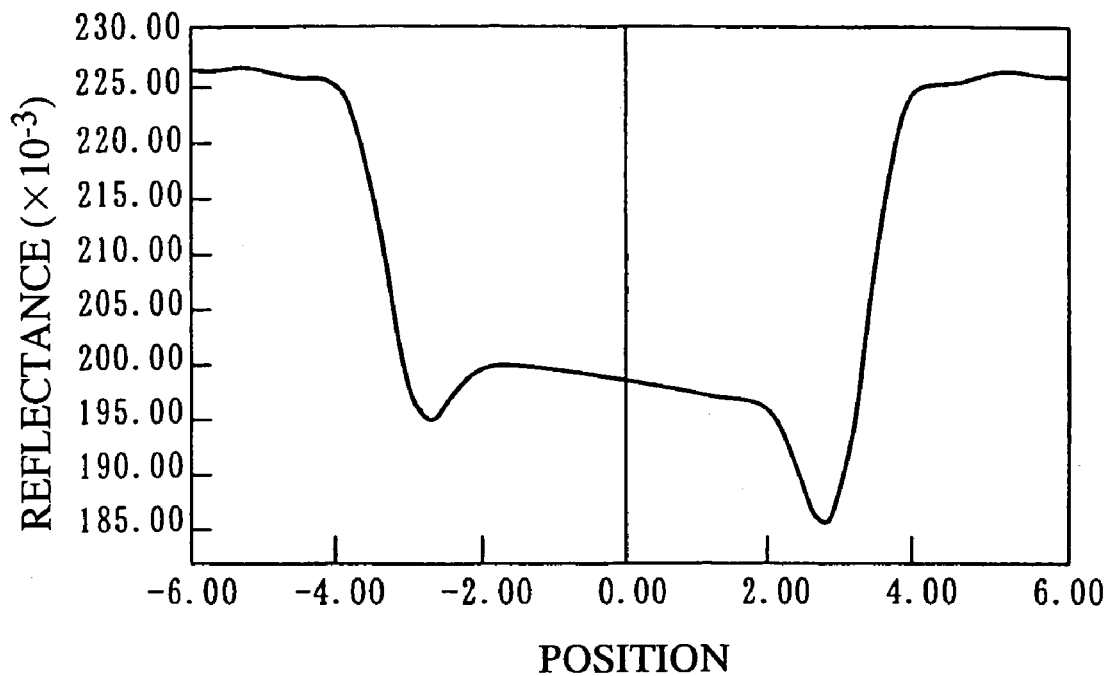
FIG. 8 is a relational diagram showing the relationship between the position for a signal which has undergone filtering with a low pass index of 1.0, and the reflectance.
Figure 9:
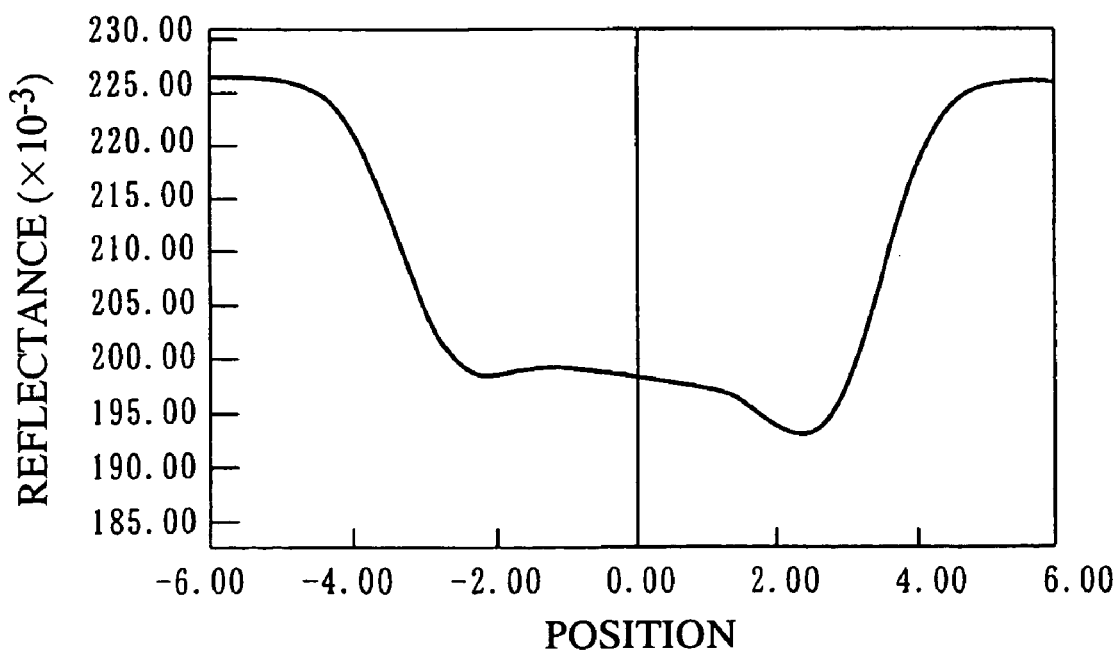
FIG. 9 is a relational diagram showing the relationship between the position for a signal which has undergone filtering with a low pass index of 0.2, and the reflectance.

As an example, a signal which has undergone filtering at a low pass index of 1.0 is shown in FIG. 8, and a signal which has undergone filtering at a low pass index of 0.2 is shown in FIG. 9. Using the type of signals shown in these figures, mark position measurements are performed for each low pass index value. In this particular embodiment 10 separate low pass index values (low pass index=1.0, 0.9, 0.8, . . . , 0.2, 0.1) were used, but the present invention is not limited to this case, and can be applied to any case where filtering is conducted using at least two low pass index values.

Figure 10:
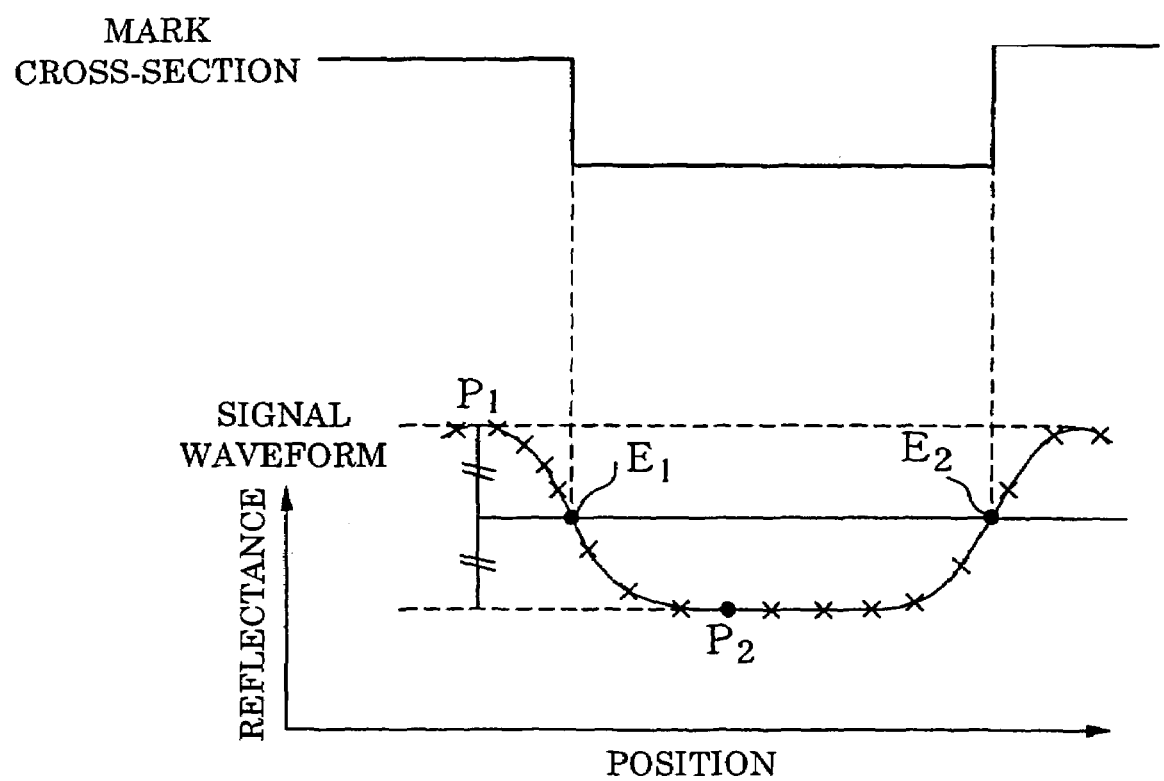
FIG. 10 is an explanatory diagram describing edge measurement.

As follows is a description of edge measurement, using FIG. 10. FIG. 10 is a diagram for describing the processing when an edge detection is conducted.

In a typical edge detection algorithm, first, the rise and fall of the curve is used to find the maximum and the minimum. These values are then assigned as the maximum and minimum values for that edge. In the example in FIG. 10, the sampling point $P_1$ becomes the edge maximum value, and the sampling point $P_2$ becomes the edge minimum value. Having determined the maximum and minimum values of the edge, a slice level SL is set at, for example, the midway value between the maximum and minimum, and the edge positions (mark positions) $E_1$ and $E_2$ are set at the positions where the slice level SL cuts the waveform.

At step S3, based on each of the mark positions obtained at step S2, the mark position X is determined using the following arithmetic expression.

$X$=(measured value $CH$ of mark position measurement $P$)−{(measured value $CL$ of mark position measurement $Q$)−(measured value $CH$ of mark position measurement $P$)}×$R$ In this arithmetic expression, R is a coefficient (R>0) which is set to an appropriate value depending on the mark shape. In the present embodiment, a value of R=0.9 is used. According to the above arithmetic calculation, in the present embodiment, the measurement result at a low pass index of 1.0 (a first calculation result) is used as the measured value CH of the measurement P which yields the highest resolution signal, whereas the measurement result at a low pass index of 0.2 (a second calculation result) is used as the measured value CL of the measurement Q (refer to FIG. 4). In this manner, the error (deviation amount) between the mark position X (determined by the aforementioned arithmetic expression), and the mark position with no measurement position deviation (the true mark position) is the error labeled with the symbol Z in FIG. 4.

The present invention is not restricted to the situation described above, and the mark position X could also be determined using the measurement results at other low pass index values (for example, the measurement result at an index value of 0.9 and the measurement result at an index value of 0.1) in accordance with a variety of different situations (mark shapes and the like). Furthermore, based on a plurality of measurement results, a plurality of calculated values X (a difference X1 between the measured value at a frequency of 1.0 and the measured value at a frequency of 0.2, and a difference X2 between the measured value at a frequency of 0.9 and the measured value at a frequency of 0.1) could be determined, and these calculated values then averaged to determine a single mark position X.

As follows is a description of a case where the mark position measurement is performed using a different measurement method (the aforementioned correlation method) from the aforementioned edge measurement method.

First is a description of the case where template matching is used.

Figure 7:
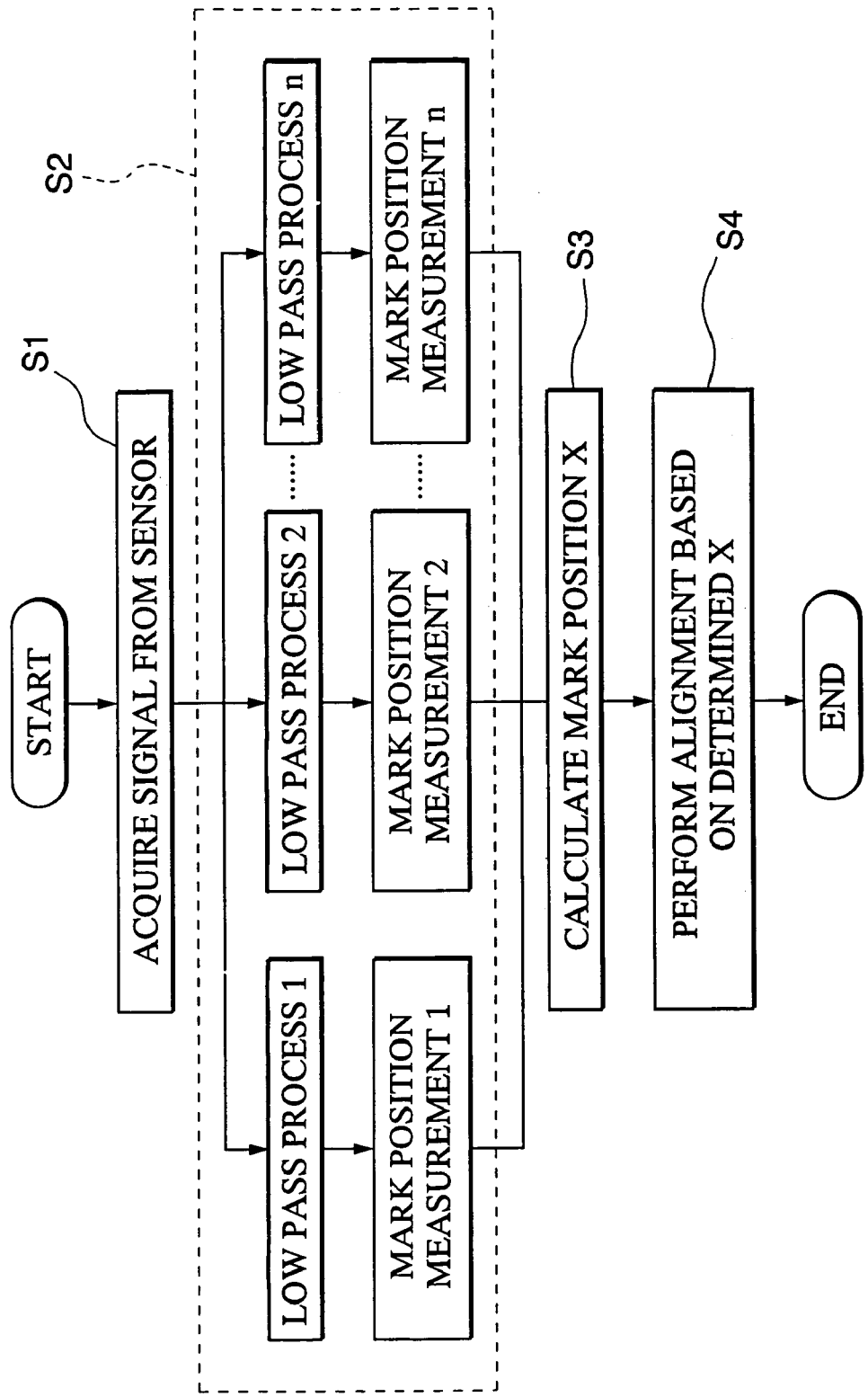
FIG. 7 is a diagram showing an embodiment of the present invention, and represents a flowchart for an alignment process 1 using a LSA system or a FIA system.

In template matching, in each of the steps of the parallel processes labeled "mark position measurement 1" through "mark position measurement n" in step S2 of FIG. 7, a correlation (template matching) is performed between a template with a fixed frequency configuration (a single template) and each of the mark signals (target signals for measurement with different frequency configurations) from low pass processing at each low pass index (different levels of filtering), and the position of the correlation value Max in each case (a plurality of position information) is measured.

Then, at step S3, based on the plurality of position information obtained at step S2, a single mark position X can be determined using the same method as described in the aforementioned step S3 of FIG. 7.

In the case of the template matching described above, the frequency configuration of the template used was fixed, and only the frequency configuration of the matching targets (in other words, only the mark signals) for the template were altered, but template matching could also be carried out with the template also being subjected to filtering by the same low pass index as the mark signal.

In other words, in each of the steps of the parallel processes "low pass process 1" through to "low pass process n" in step S2 of FIG. 7, not only the mark signal, but also the template, could be subjected to filtering using the same low pass index, and at each of the steps labeled "mark position measurement 1" through "mark position measurement n" in step S2, a correlation (template matching) could then be performed between the template with a fixed frequency configuration (the single template), and a template and each of the mark signals (target signals for measurement with different frequency configurations) which have been subjected to low pass processing at each low pass index (different levels of filtering), and the position of the correlation value Max in each case (a plurality of position information) then measured.

Next is a description of another correlation method, such as that disclosed in Japanese Examined Patent Application, Second Publication No. Sho 56-2284, in which position measurements are performed using a so-called "folded autocorrelation method", wherein the symmetry of the target signal for measurement itself is used for carrying out the matching process.

In the folded autocorrelation method, unlike the template matching described above, templates are not used, and so at each of the steps of the parallel processes "mark position measurement 1" through to "mark position measurement n" in step S2 of FIG. 7, each of the mark signals from low pass processing at each low pass index (target signals for measurement with differing frequency configurations) are folded (reflected) and correlated at various positions, and the positions which display the maximum correlation (a plurality of position information) are then measured.

Then at step S3, based on the plurality of position information obtained at step S2, a single mark position X can be determined using the same method as described in the aforementioned step S3 of FIG. 7.

At step S4, the positioning of the wafer W, and the alignment of the reticle R and the wafer W are carried out based on the mark position X (position information) obtained at step S3. The techniques used for these positioning and alignment steps are widely known, and so no description is given here.

The description above outlines a determination method for the mark position X in the case where low pass filtering is performed at a plurality of low pass index values.

The above example (FIG. 4 and FIG. 7) disclosed a method wherein low pass filtering processing at differing low pass degrees was used as a technique for altering the frequency configuration, but alteration of the frequency configuration is not restricted to this particular technique. For example, the frequency configuration could also be altered by using a technique distinguishing between the case where no filtering process is performed, and the case where low pass filtering is performed (another technique which could be considered for altering the frequency configuration is high pass filtering (the reduction or removal of the proportion of the low frequency component in a signal), although the reduction or removal of the low frequency component is associated with marked variations in the shape of the image, and so using a high pass processed signal for performing position measurements would be difficult in the edge measurement method described in the aforementioned alignment process 1. Consequently high pass processing is not performed in the edge measurement method of the alignment process 1). Based on the results obtained from these signals of differing frequency configuration, the asymmetry of the mark signal could then be determined.

The frequency characteristics of each of the various filters used during the various aforementioned filtering processes are described below.

[Alignment Process 2 in the Case of a LSA System or a FIA System]

Figure 11:
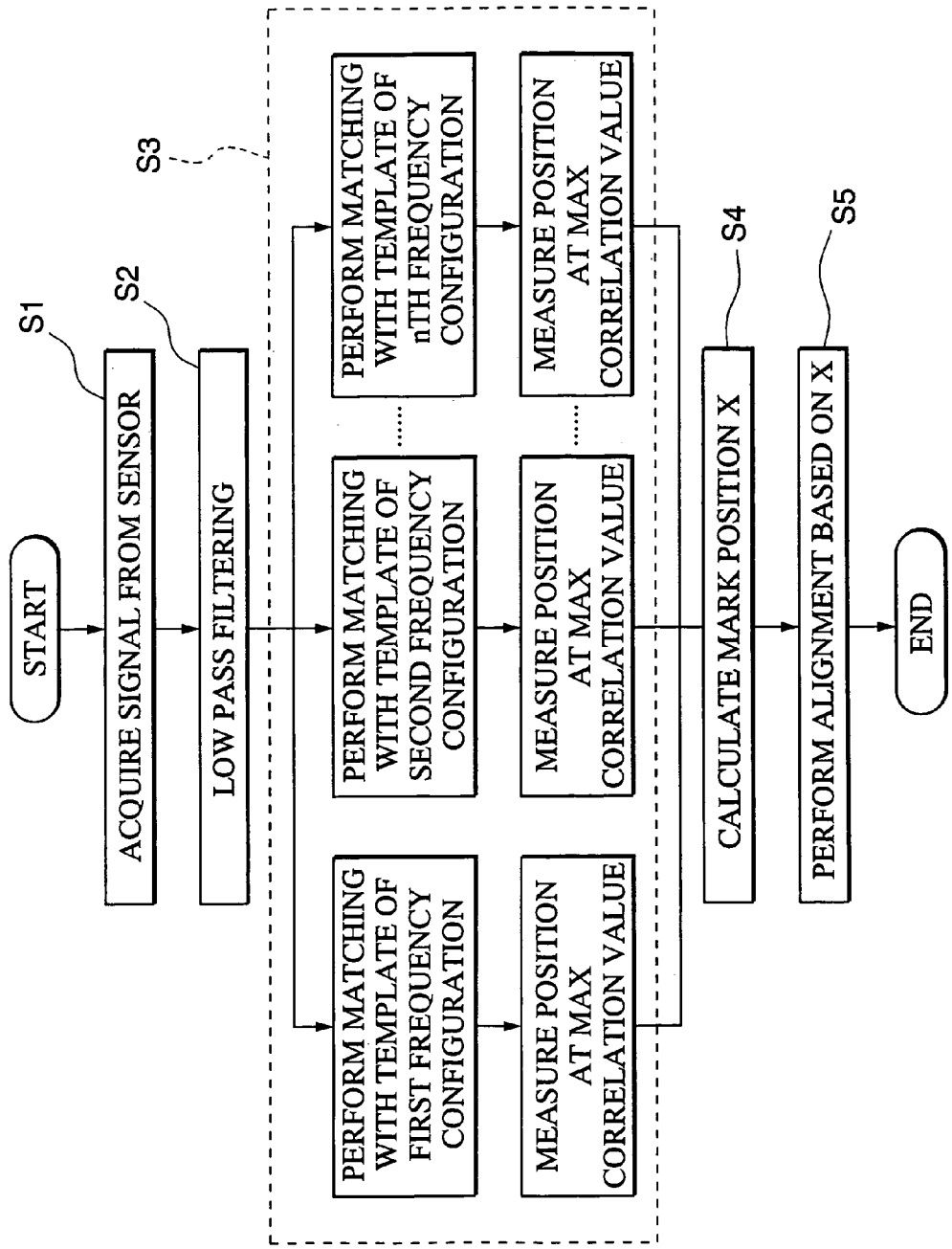
FIG. 11 is a diagram showing an embodiment of the present invention, and represents a flowchart for an alignment process 2 using a LSA system or a FIA system.

Next is a description of the operation of an alignment control system 19 of a different configuration to that described above for the alignment process 1, in a LSA alignment system or a FIA alignment system, based on the flowchart of FIG. 11.

First, at step S1, a signal (an image signal) detected by the reticle alignment sensor 16 or the wafer alignment sensor 17 is acquired. Next, at step S2, low pass filtering of a predetermined frequency is performed on the acquired signal. This low pass filtering is not essential, and the signal acquired at step S1 could also be used, as is, in the control steps from step S3 onwards.

At step S3, template matching is carried out on the filtered signal, using a plurality of templates with different frequency components (frequency configurations). Subsequently, mark position measurements are performed for each of the template matches. Specifically, for each template matching, the position at the point which displays the maximum correlation is used as each mark position (measured value, measurement result). The mark position measurements for this plurality of templates are performed so that the arithmetic processing for each template matching is conducted in parallel, as shown in FIG. 11.

Figure 12:
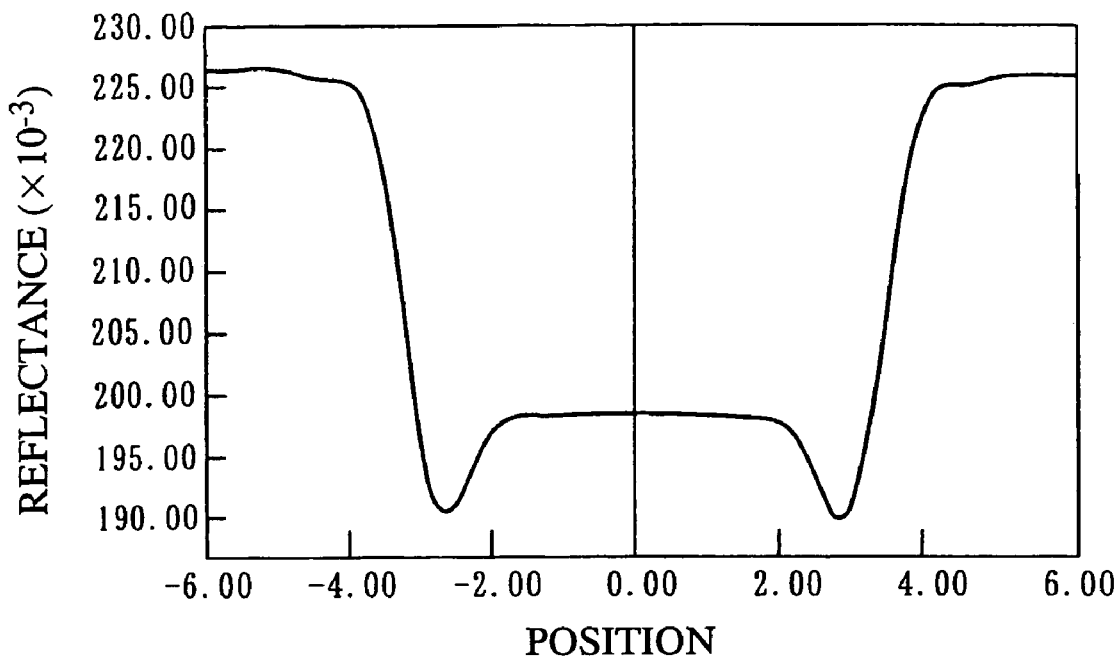
FIG. 12 is a relational diagram showing the relationship between the position for a template corresponding with a low pass index of 1.0, and the reflectance.
Figure 13:
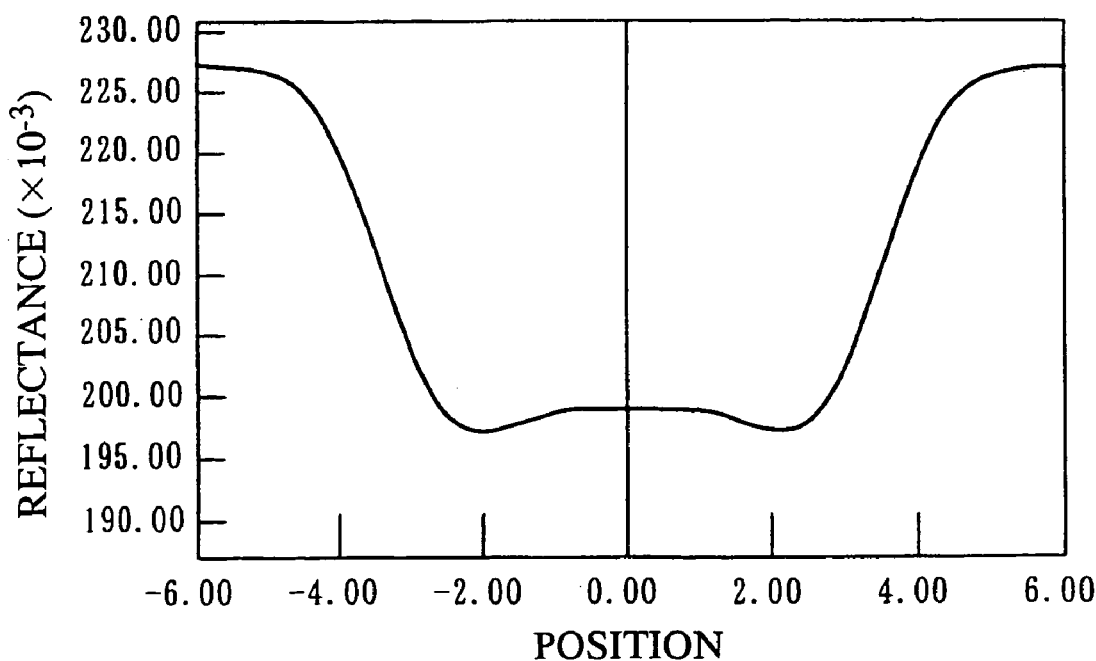
FIG. 13 is a relational diagram showing the relationship between the position for a template corresponding with a low pass index of 0.1, and the reflectance.

The templates correspond with different marks (mark shapes) and are stored in advance within a memory section (not shown in the figures) of the alignment control system 19. Typically one template is prepared for one mark, and by carrying out low pass filtering of this prepared template, a plurality of templates of different frequency configurations are then prepared. As an example, a template corresponding with a low pass degree of 1.0 is shown in FIG. 12, and a template corresponding with a low pass degree of 0.1 is shown in FIG. 13. Template matching is then carried out using a plurality of templates with this type of signal waveform In the present embodiment, templates corresponding with 10 separate low pass index values (low pass index=1.0, 0.9, 0.8, . . . , 0.2, 0.1) were used, but the present invention is not limited to this case, and can be applied to any case where template matching is conducted using templates corresponding with at least two low pass index values.

At step S4, the mark position X is determined using the following arithmetic expression, based on each of the mark positions obtained at step S3.

$X$=(measured value $CH$ of mark position measurement $P$)−{(measured value $CL$ of mark position measurement $Q$)−(measured value $CH$ of mark position measurement P)}×$R$ In this arithmetic expression, R is a coefficient (R>0) which is set to an appropriate value depending on the mark shape. In the present embodiment, a value of R=1.4 is used. According to the above arithmetic calculation, in the present embodiment, the measurement result for a template matching using a template corresponding with a low pass index of 1.0 (a first calculation result) is used as the measured value CH of the measurement P which yields the highest resolution signal, whereas the measurement result for a template matching using a template corresponding with a low pass index of 0.1 (a second calculation result) is used as the measured value CL of the measurement Q (refer to FIG. 5). In this manner, the error (deviation amount) between the mark position X (determined by the aforementioned arithmetic expression), and the mark position with no measurement position deviation (the true mark position) is the error labeled with the symbol Z in FIG. 5.

The present invention is not restricted to the situation described above, and the mark position X could also be determined using the measurement results of template matching using templates corresponding with other low pass index values (for example, the measurement result at a frequency of 0.9 and the measurement result at a frequency of 0.2) in accordance with a variety of different situations (mark shapes and the like). Furthermore, based on a plurality of measurement results, a plurality of calculated values X (a difference X1 between the measured value at a frequency of 1.0 and the measured value at a frequency of 0.1, and a difference X2 between the measured value at a frequency of 0.9 and the measured value at a frequency of 0.2) could be determined, and these calculated values then averaged to determine a single mark position X.

At step S5, the positioning of the wafer W, and the alignment of the reticle R and the wafer W are carried out based on the mark position X (position information) obtained at step S4. The techniques used for these positioning and alignment steps are widely known, and so no description is given here.

The description above outlines a determination method for the mark position X in the case where template matching (normalized cross correlation) is carried out.

In the process 2 described above, template matching was conducted using a plurality of templates with different frequency components (frequency configurations). As follows is a description of a modified example of template matching.

In this modified example, the frequency configuration of the template is fixed (a single template), and without altering the frequency configuration of the target signal for measurement (the signal detected by the alignment sensor 16 or 17), mark position measurements are conducted by carrying out filtering of differing low pass degrees on a correlation function calculated from the template and the target signal for measurement.

By performing low pass filtering on the correlation function, the peak position of the correlation function varies, and so by determining this peak position for each low pass filtered correlation function, a plurality of position information can be obtained.

Describing the operational flow for this technique based on FIG. 11, the target signal for measurement is acquired at step S1, and at step S2, low pass filtering is not performed as in FIG. 11, but rather a correlation function is determined from the acquired target signal for measurement and a template with a single frequency configuration.

Subsequently, at step S3, filtering of differing low pass degrees is performed on the correlation function obtained at step S2, and processing for determining the peak positions of each of the filtered correlation functions is carried out in parallel, thereby determining position information for each of the correlation functions.

Then at step S4, based on the plurality of position information obtained at step S3, a single mark position X is determined using the same method as described in step S4 of FIG. 11.

Furthermore the above description disclosed a method wherein low pass filtering processing of differing low pass degrees was used as a technique for altering the frequency configuration, but alteration of the frequency configuration is not restricted to this particular technique. For example, the frequency configuration could also be altered by using high pass filtering of differing high pass degrees.

Alternatively, mark signals of mutually different frequency configurations could also be obtained by using a technique distinguishing between four different cases, namely a case 1 wherein no filtering processing is performed (in other words, the case where the signal acquired at step S1 is used, as is, for conducting the position measurement), a case 2 wherein only high pass filtering of a certain degree is performed, a case 3 wherein only low pass filtering of a certain degree is performed, and a case 4 wherein filtering processing is carried out so as to incorporate a larger proportion of a specified frequency (this filtering technique could be either of A: a technique in which filtering processing is performed with a certain degree of both high pass and low pass filtering, with a middle frequency configuration then being obtained; or B: a technique using band pass filtering). Then, the asymmetry of the mark signal could be determined based on the results obtained from the mark signals (signals of different frequency configurations) of at least two of this plurality of cases (for example, the aforementioned case 1 to case 4).

The frequency characteristics of each of the various filters used during the various filtering processes are described below.

[Alignment Process 3 in the Case of a LSA System or a FIA System]

Figure 14:
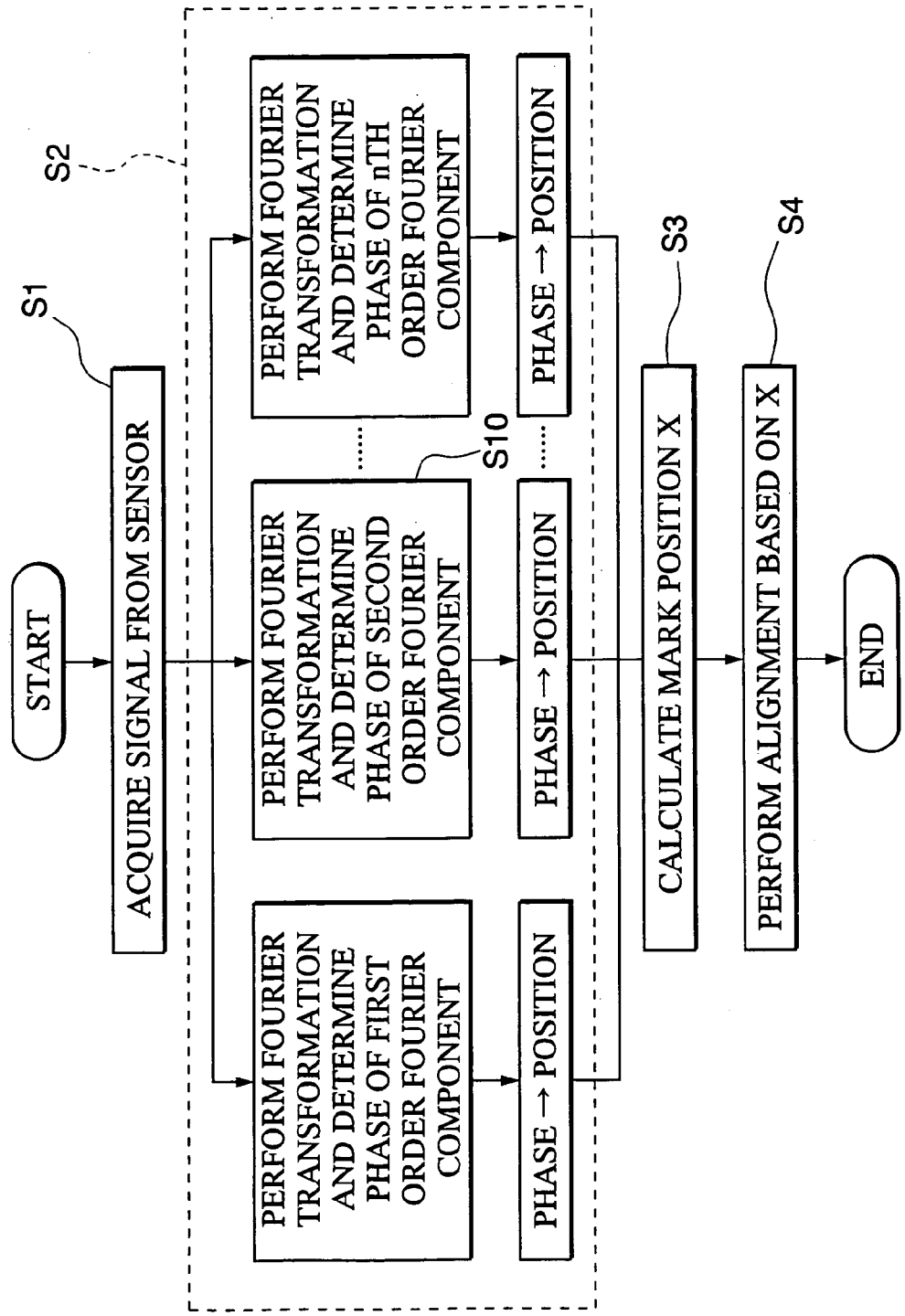
FIG. 14 is a diagram showing an embodiment of the present invention, and represents a flowchart for an alignment process 3 using a LSA system or a FIA system.

Next is a description of the operation of an alignment control system 19 (Fourier transformation device) of a different configuration from that described above for the alignment processes 1 and 2, in a LSA alignment system or a FIA alignment system, based on the flowchart of FIG. 14.

First, at step S1, a signal (an image signal) detected by the reticle alignment sensor 16 or the wafer alignment sensor 17 is acquired. Next, at step S2, a Fourier transformation is performed on the acquired signal, and the phase is determined for each nth order Fourier component. Subsequently, by using known methods to convert each of the Fourier component phases into a position, the mark position (measured value, measurement result) at each order Fourier component is determined. These mark position measurements for each order Fourier component are performed so that, as shown in FIG. 14, the arithmetic processing for each of the Fourier components is conducted in parallel.

During the process of determining a position from the phase of a Fourier component, when the position of a high order Fourier component is to be determined, detection must first be performed at a low order Fourier component. The reason for this requirement is that with higher order Fourier components the period of the signal shortens, and so specifying which portion of the signal corresponds with the range of the measurement target (the alignment mark) becomes difficult. Consequently, in the case where, for example, the position of the second order Fourier component is to be determined at step S2, then within the step S10, the first order Fourier component is first detected and the location of the signal for measurement specified to a certain degree, before the position of the second order Fourier component is determined. The case of an nth order Fourier component is identical.

At step S3, based on each of the mark positions obtained at step S2, the mark position X is determined using the following arithmetic expression.

$$X = (\text{measured value } CH \text{ of } P\text{th order Fourier component}) - \{(\text{measured value } CL \text{ of } Q\text{th order Fourier component}) - (\text{measured value } CH \text{ of } P\text{th order Fourier component})\} \times R$$

In this arithmetic expression, R is a coefficient (R>0) which is set to an appropriate value depending on the mark shape.

Moreover, the present invention is not restricted to the above process, and a plurality of calculated values X1 to Xn could be determined based on a plurality of measurement results, and these calculated values then averaged to determine a single calculated value X.

At step S4, the positioning of the wafer W, and the alignment of the reticle R and the wafer W are carried out based on the mark position X (position information) obtained at step S3. The techniques used for these positioning and alignment steps are widely known, and so no description is given here.

The description above outlines a determination method for the mark position X in the case where Fourier transformations are performed.

[Alignment Process in the Case of a LIA System]

Next is a description of the operation of an alignment control system 19 in a LIA alignment system.

The present invention can be applied to any situation in which alignment is carried out using a system in which the measurement target (the object to be detected, the position detection mark) is irradiated with a detection beam, and diffracted light generated from the mark is used for the alignment.

Figure 15:
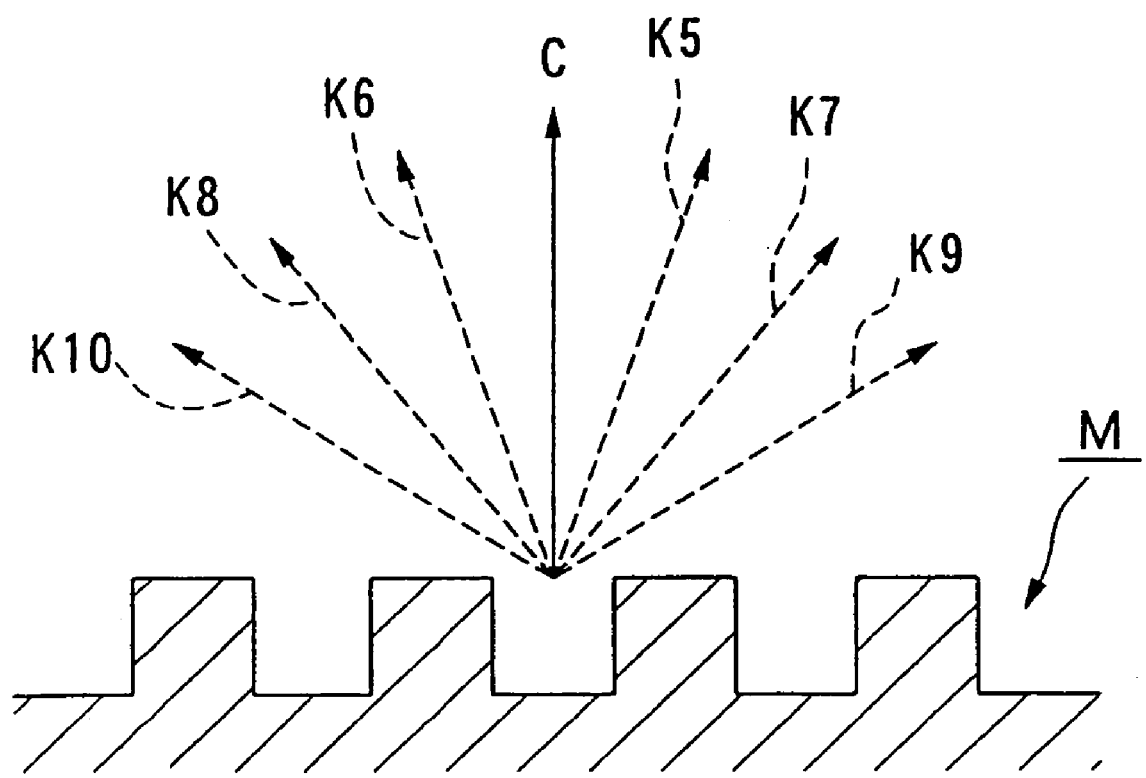
FIG. 15 is an explanatory diagram describing a system for performing alignment by using the diffracted light from a single detection light beam.

For example, as shown in FIG. 15, the present invention could also be applied to a system wherein a single detection light beam C is irradiated onto a mark M, and alignment is then carried out using the plurality of orders of diffracted light emanating from the mark M as a result of the light beam C. In such a case, predetermined signals could be obtained by receiving the ±1 order light beams K5 and K6, the ±2 order light beams K7 and K8, and the ±3 order light beams K9 and K10 respectively from the light beam C.

In a LIA system (a system in which diffracted light from the measurement target, namely a position detection mark, is detected), the higher the order of the diffracted light beam detected, the higher the resolution of the signal obtained becomes, thereby improving the detection precision of the mark position. However, immediately detecting diffracted light of a higher order results in a shortening of the period of the diffracted light signal with increasing order (if the period of first order diffracted light is P, then the period of nth order diffracted light would be P/n). As the period of the signal shortens, specifying which portion of the signal corresponds with the range of the measurement target (the alignment mark) becomes difficult.

As a result, when a high order diffracted light beam is to be detected in a LIA alignment system, it is necessary to first perform a broad range detection by detecting a lower order diffracted light beam, before carrying out a subsequent narrow range detection by detecting the higher order diffracted light.

Figure 16:
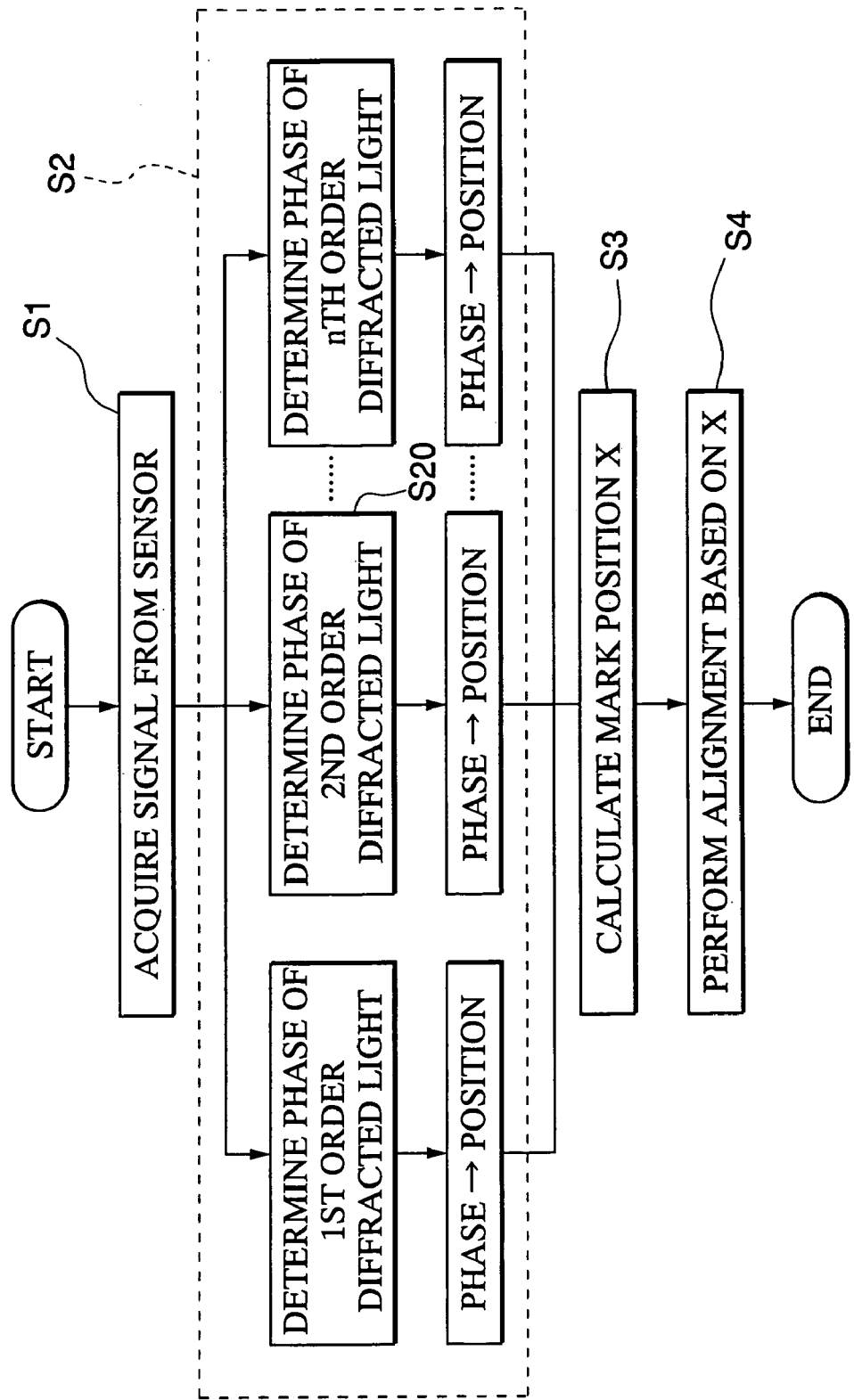
FIG. 16 is a diagram showing an embodiment of the present invention, and represents a flowchart for an alignment process using a LIA system.

As follows is a description of the operation of the alignment control system 19, based on the flowchart of FIG. 16.

First, at step S1, a signal (a phase signal) detected by the reticle alignment sensor 16 or the wafer alignment sensor 17 is acquired. At the next step S2, based on the signals of each of the acquired diffracted light beams, the phase is determined for each of n orders of diffracted light. As described above, when determining the phase of a higher order diffracted light beam, a lower order diffracted light beam must first be detected, and so within the step S20 for example, first order diffracted light is first detected before the second order light beam is detected. The case of an nth order diffracted light beam is identical.

Subsequently, the mark position (measured value, measurement result) for each diffracted light beam is determined by converting the phase of each diffracted light beam to a position using known methods. These mark position measurements at each order of diffracted light are performed so that, as shown in FIG. 16, the arithmetic processing for each order of diffracted light is conducted in parallel.

At step S3, based on each of the mark positions obtained at step S2, the mark position X is determined using the following arithmetic expression.

$X$=(measured value $CH$ of $P$th order diffracted light)−{(measured value $CL$ of $Q$th order diffracted light)−(measured value $CH$ of $P$th order diffracted light)}×$R$ In this arithmetic expression, R is a coefficient (R>0) which is set to an appropriate value depending on the mark shape. In this particular embodiment, a value of R=0.13 is used. Furthermore in this embodiment, in the above arithmetic calculation, the measurement result from third order diffracted light (a first calculation result) is used as the measured value CH of Pth order diffracted light which yields the highest resolution signal, whereas the measurement result from first order diffracted light (a second calculation result) is used as the measured value CL of Qth order diffracted light (refer to FIG. 6). In this manner, the error (deviation amount) between the mark position X (determined by the aforementioned arithmetic expression), and the mark position with no measurement position deviation (the true mark position) is the error labeled with the symbol Z in FIG. 6.

Moreover, the present invention is not restricted to the above process, and measurement results from diffracted light of other orders could also be used. Furthermore, a plurality of calculated values X1 to Xn could be determined based on a plurality of measurement results, and these calculated values then averaged to determine a single calculated value X.

At step S4, the positioning of the wafer W, and the alignment of the reticle R and the wafer W are carried out based on the mark position X (position information) obtained at step S3. The techniques used for these positioning and alignment steps are widely known, and so no description is given here.

The description above outlines a determination method for the mark position X in a LIA alignment system.

Figure 4:
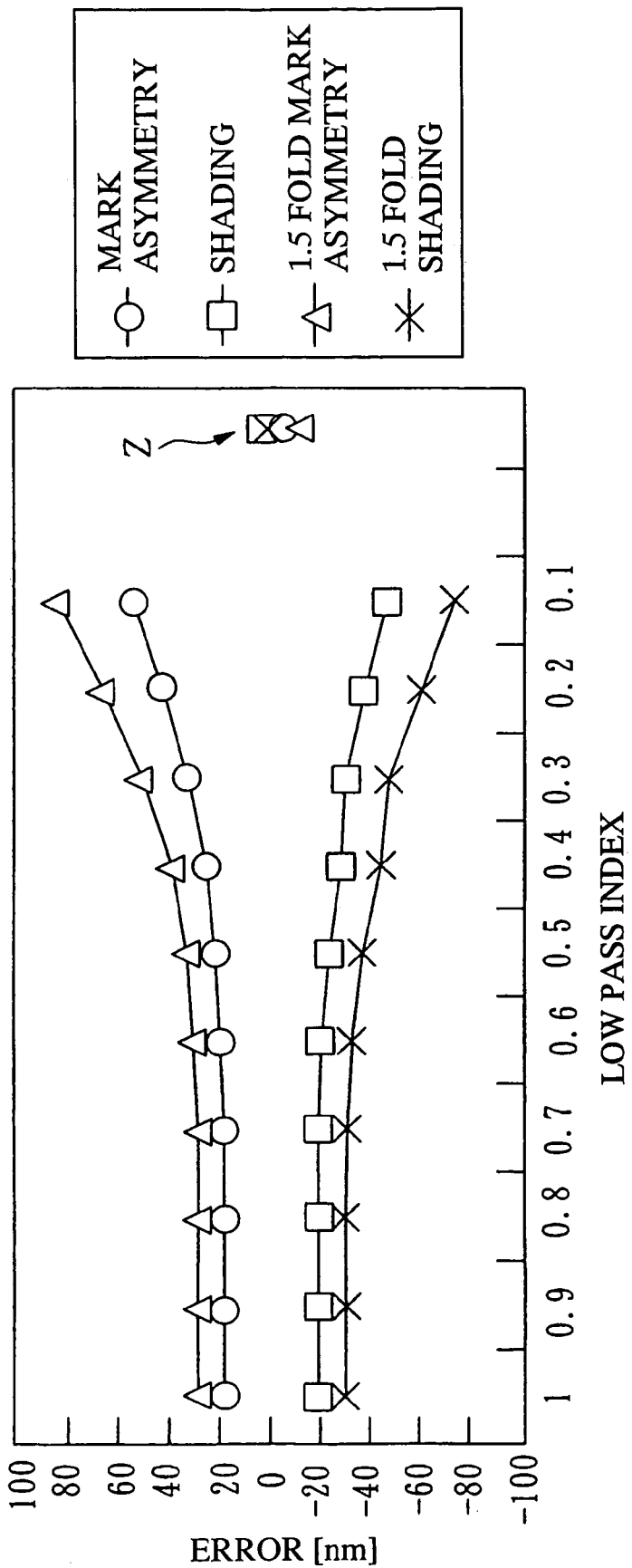
FIG. 4 is a relational diagram showing the relationship between the low pass index and the positional deviation error in the case of edge detection.
Figure 5:
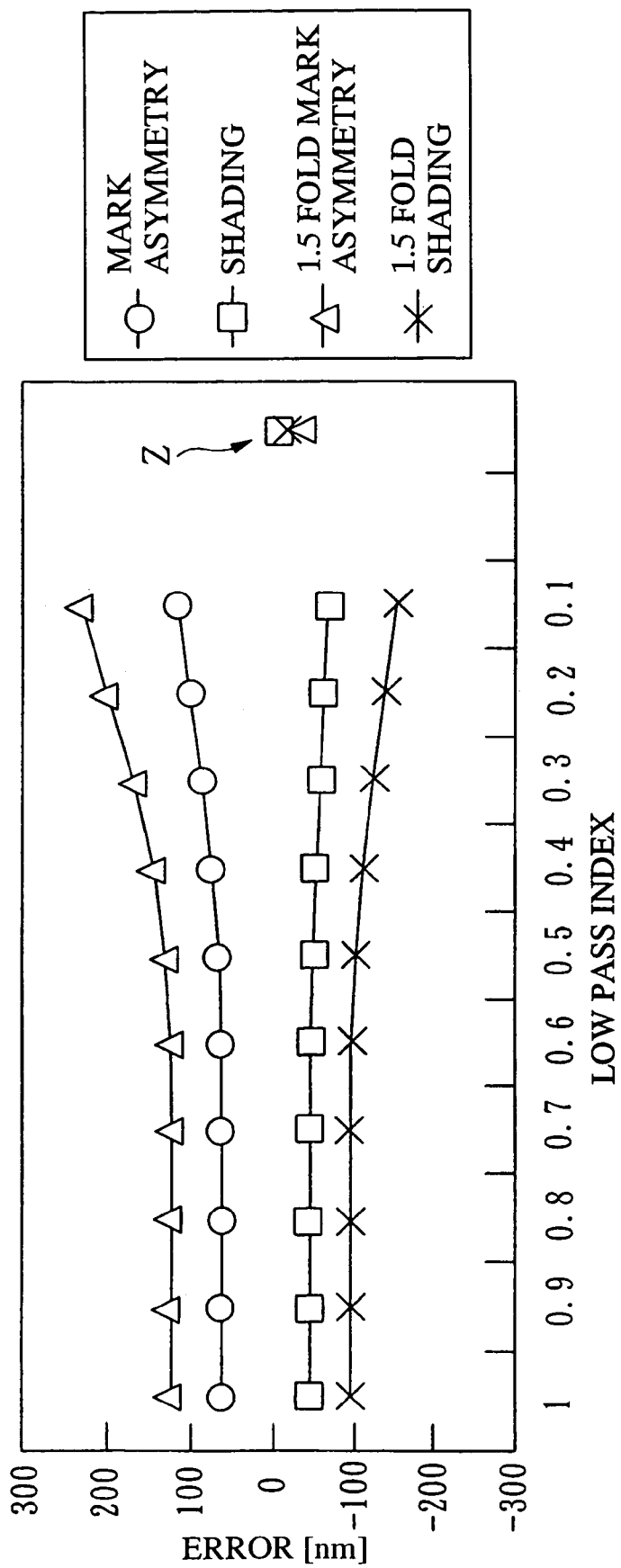
FIG. 5 is a relational diagram showing the relationship between the low pass index and the positional deviation error in the case of template matching.
Figure 6:
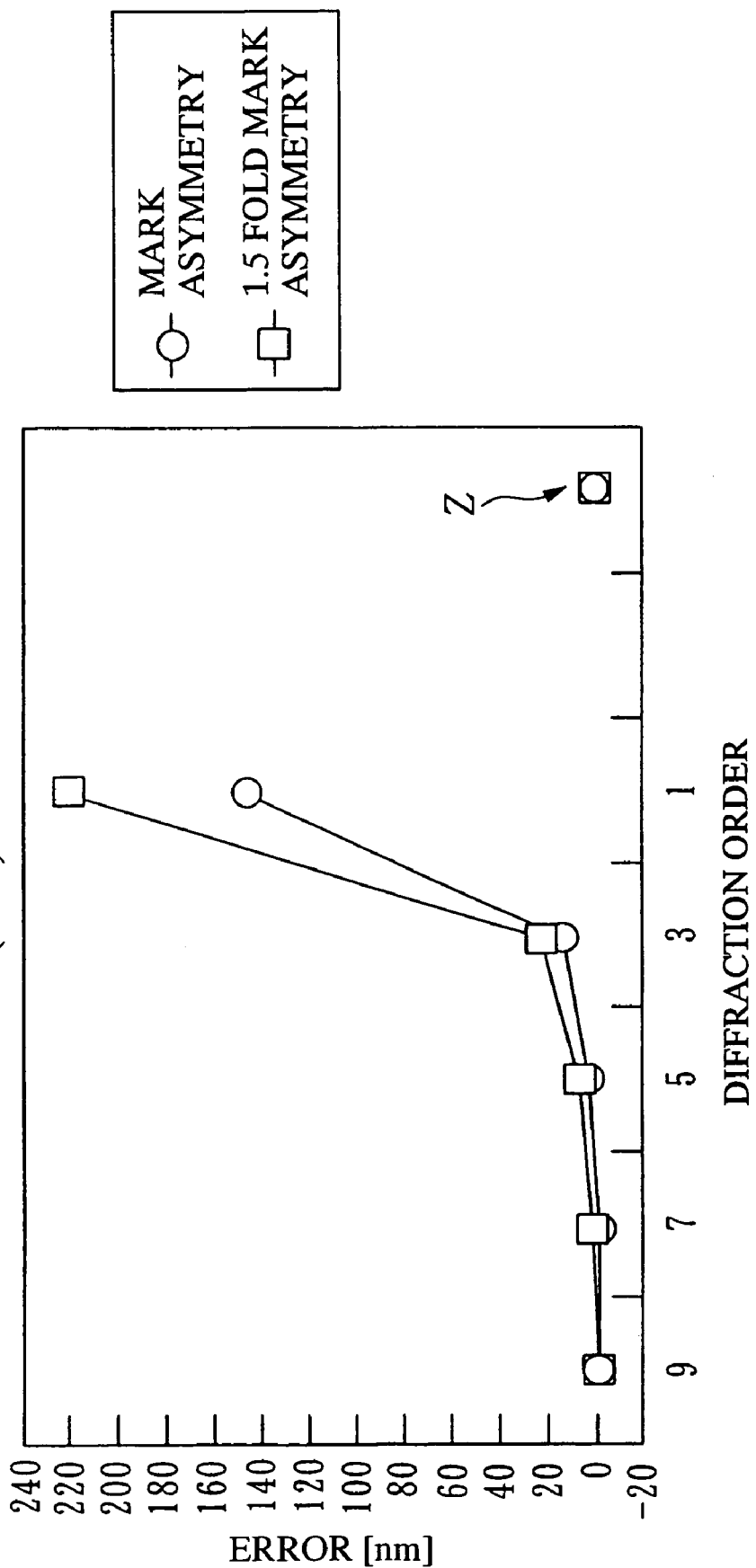
FIG. 6 is a relational diagram showing the relationship between the diffraction order and the positional deviation error in an LIA system.

However, as shown in FIG. 4 and FIG. 5, the stronger the degree of low pass (in other words, the smaller the value of the low pass index, namely the larger the proportion of the low frequency component in a signal) the worse the precision becomes (the larger the positional deviation error becomes). This phenomenon is due to the fact that the effect on the positional deviation increases for lower frequency components. Viewing this phenomenon from the opposite angle, the larger the proportion of a high frequency component incorporated in a signal, in other words if high pass (a reduction or removal of the proportion of the low frequency component in a signal) is performed, then the positional deviation error decreases and the precision improves. However, reduction or removal of the low frequency component, as described above, is associated with marked variations in the shape of the image, and so in the edge measurement method described in the alignment process 1 of FIG. 7, using a high pass processed signal (target signal for measurement) for performing position measurements would be difficult. An example of a measurement method in which a high pass processed signal is used for performing position measurements is a measurement method using correlation methods.

Based on the above phenomenon, as follows is a description of an example (LSA, FIA process 4) in which position measurements are carried out by high pass processing of the signal used for position measurements, based on FIG. 17.

[Alignment Process 4 in the Case of a LSA System or a FIA System]

Figure 17:
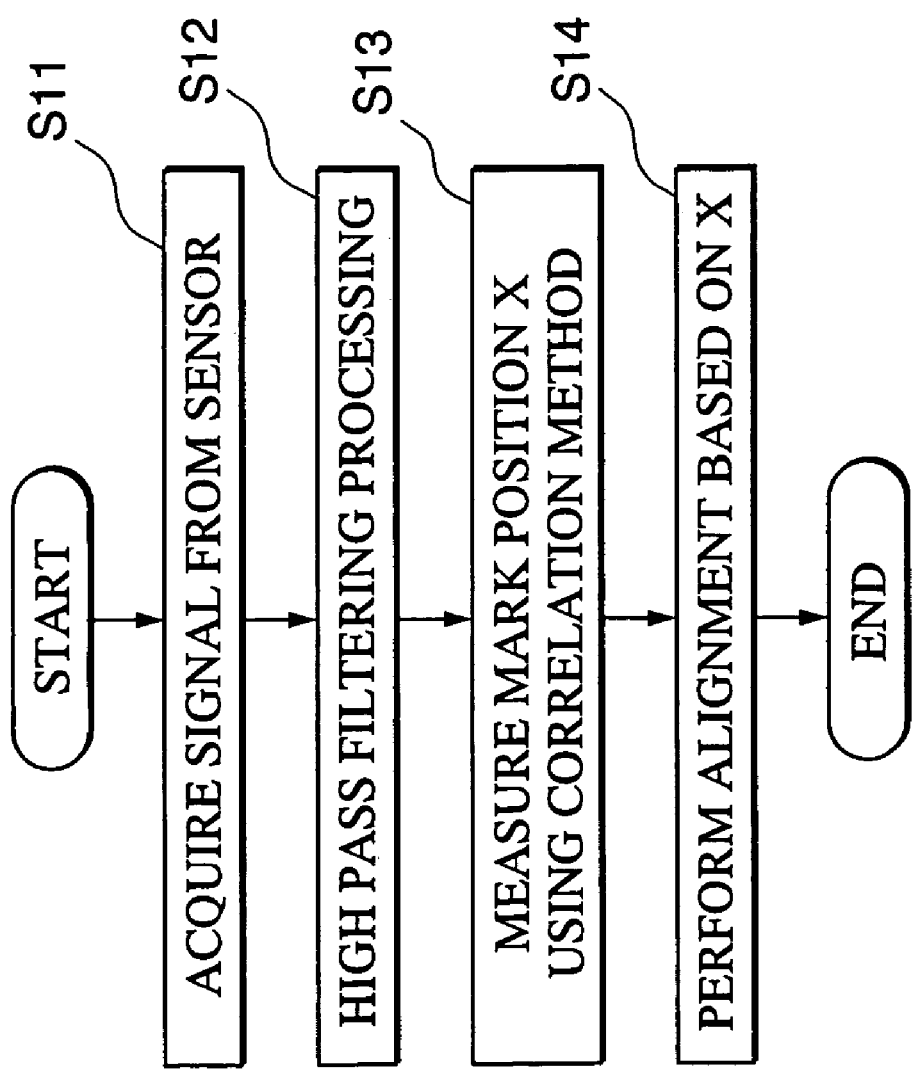
FIG. 17 is a flowchart for the case where mark position information is determined by a correlation method.

FIG. 17 is a diagram describing the operations in a case where mark position information is determined by using a correlation method (a template matching method) on mark signals which have undergone high pass filtering processing.

First, at step S11, a signal relating to a mark detected by either of the alignment sensors 16 or 17 (for example, an image signal with a certain intensity value, a waveform signal corresponding with an image signal, or a signal produced by preliminary processing of a mark signal) is acquired. This acquired signal is hereafter referred to as the "original signal" of the target signal for measurement.

Next, at step S12, high pass filtering processing is performed on the original signal, and the proportion within the original signal of the frequency component less than a predetermined frequency is lowered (or alternatively the proportion of the frequency component less than a predetermined frequency is removed). Furthermore, at step S12, in parallel with the high pass filtering of the original signal, high pass filtering processing is also carried out on the template, using the same high pass filtering method as that used on the original signal (namely, using the same high pass index as that used during the filtering of the original signal).

This high pass filtering processing of the template need not necessarily be performed in parallel with step S12, but could also be performed in advance.

An example of a method of high pass filtering processing is a method wherein by subtracting from the target signal (the original signal, the template) a signal which has undergone low pass filtering with a standardized filter of a predetermined low pass degree, the original signal is converted to a high pass filtered signal. In such a case, controlling the high pass degree applied to the original signal and the template may be achieved by altering the low pass index (low pass degree) used during low pass filtering.

The filtering processing is not restricted to the filtering technique described above. By differentiating the target signal (the original signal, the template) the frequency gain can be increased more for the high frequency components, thereby achieving the same filtering effect as the aforementioned technique. As a result, using this differentiation technique offers another method by which the proportion of the high frequency component within a signal can be increased (the proportion within the original signal of the frequency component less than a predetermined frequency can be reduced). At the time of this differentiation, a filter known as a differentiation filter, which is described below, could also be used for performing the filtering.

Furthermore another possible filtering process different from those described above comprises performing a Fourier transformation of the target signal (the original signal, the template), multiplying the target signal Fourier transformation result by a desired gain characteristic function, and then performing an inverse Fourier transformation on the multiplication result, and this process is also capable of achieving the same filtering effect as the aforementioned techniques.

Subsequently, at step S13, template matching is carried out for the original signal which has undergone high pass filtering at step S12, using the high pass filtered template from step S12. Within this template matching process, the position at the point where the maximum correlation is displayed is then set as the mark position X (position information, measured value, measurement result)

Then at step S14, the positioning of the wafer W, and the alignment of the reticle R and the wafer W are carried out based on the mark position X obtained at step S13.

In this manner, mark position information can be determined from a high pass processed original signal by template matching.

In FIG. 17, a position measurement method using template matching as the correlation method was shown, but in addition to this case, position measurements could also be performed using the "folded autocorrelation method" outlined in the description of FIG. 7. In the case where a folded autocorrelation method is used, templates are not used, and so at the step S12 of FIG. 17 high pass filtering is performed only on the original signal (the target signal for measurement). Then at step S13, the filtering processed target signal for measurement is reflected back at a variety of positions and a correlation taken, with the position at the point where the maximum correlation is displayed then being set as the mark position X.

Furthermore, in FIG. 17 the filtering process (step S12) comprised only high pass filtering, but the present invention is not limited to this case, and position measurements could also be performed using signals which have been subjected to both high pass filtering and low pass filtering (a signal incorporating a large proportion of a specific frequency band). An example of a suitable technique for performing both types of filtering comprises subtracting a signal which has undergone high pass filtering from a signal which has undergone low pass filtering. In the case where both types of filtering are performed, it is a requirement that the low pass index LP1 used in the high pass filtering (a signal produced by filtering an original signal with a predetermined low pass index LP1 is subtracted from the original signal) and the low pass index LP2 used in the low pass filtering are different (LP2>LP1). By performing both high pass and low pass filtering on an original signal, a signal incorporating a large proportion of a specific frequency band can be obtained.

[Alignment Process 5 in the Case of a LSA System or a FIA System]

Figure 18:
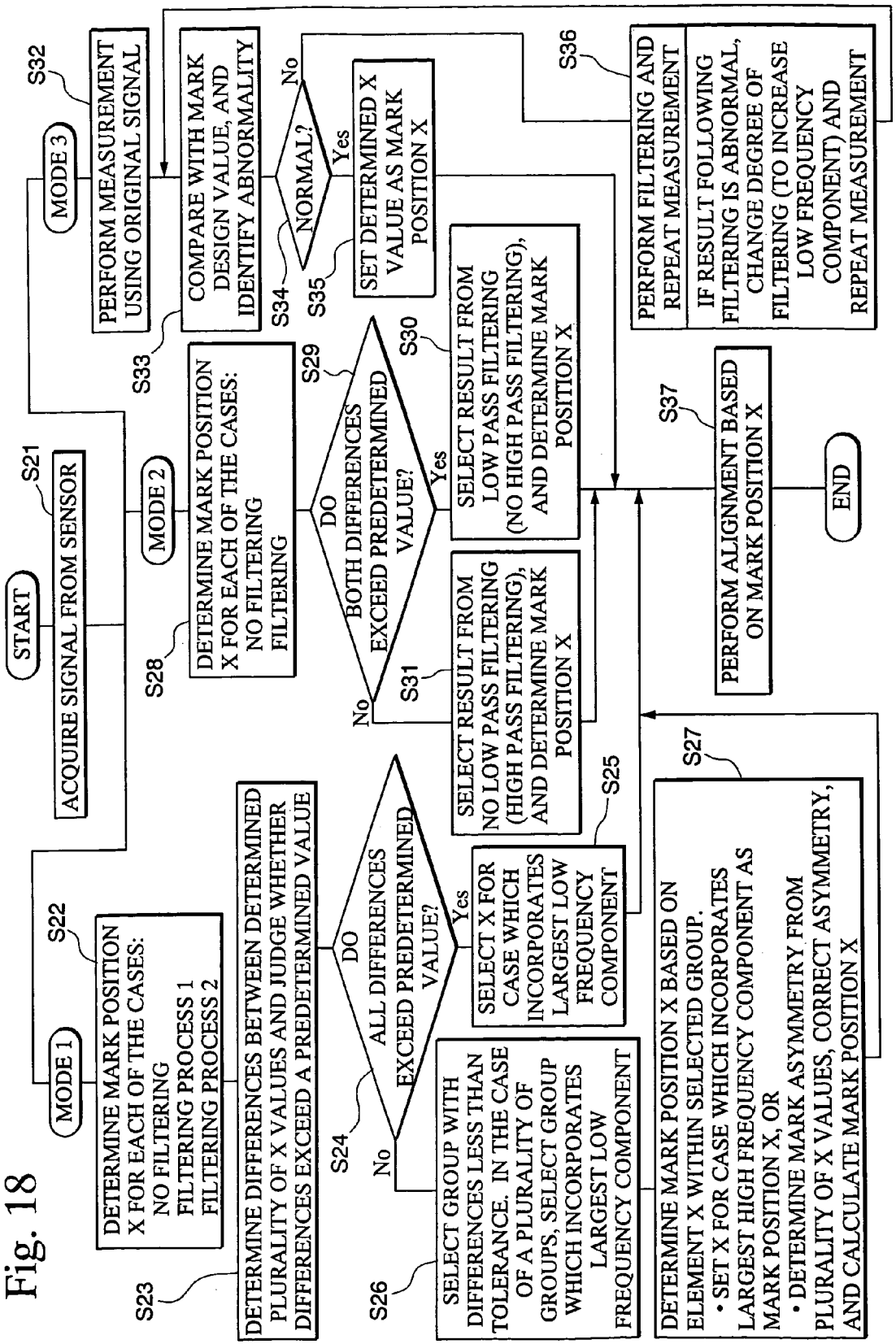
FIG. 18 is flowchart for the case where robustness is considered in determining a mark position.

FIG. 18 is a diagram showing a method for determining a mark position (including the case of determining the asymmetry of a mark signal) which takes robustness into consideration.

The robustness (noise resistance) is lower in those cases where the high frequency component is not removed (in other words, in those cases where the proportion of the low frequency component within the signal is small, namely in those cases where low pass filtering is not used or in those cases where high pass filtering is used), and misrecognition (misdetection, detection error) of the mark due to the effects of noise is more likely to occur.

Consequently, in this embodiment, in the situation where both a signal which has undergone low pass filtering and a signal which has not been low pass filtered are available (or in those cases where both a signal which has not been high pass filtered and a signal which has undergone high pass filtering are available), then in those cases where the measurement results obtained from those signals are very different, the results obtained from the signal which has undergone low pass filtering (or the signal which has not been high pass filtered, namely the signal in which the proportion of the low frequency component is large) are used for the position measurement. As follows is a description of the operations involved, based on FIG. 18.

At step S21, a signal relating to a mark detected by either of the alignment sensors 16 or 17 (for example, an image signal with a related intensity value, a waveform signal corresponding with an image signal, or a signal arising from preliminary processing of a mark signal) is acquired. This acquired signal is hereafter referred to as the "original signal" of the target signal for measurement.

Next, based on this original signal, processing is performed according to one of the modes 1 to 3 described below. The mode used could be either set as desired by the operator, or alternatively the apparatus could select one of the modes automatically in accordance with factors such as the line width of the device pattern being manufactured (the design rule), the wafer process, the shape of the mark, and the processing capabilities (processing speed and the like) of the CPU used in the exposure apparatus (or the alignment device). In terms of accuracy, it is most preferable that mode process 1 (with mode process 2 and then mode process 3 being less desirable, in that order) is performed, and so the mode process 1 could be selected in those cases where, for example, the design rule is very stringent, with either the mode process 2 or the mode process 3 selected in other cases, in accordance with factors such as the level of the design rule and the CPU processing capabilities.

First is a description of the mode process 1.

At step S22, position measurements are performed for the original signal, a signal produced by applying a filtering process 1 to the original signal, and a signal produced by applying a filtering process 2 to the original signal. The filtering process 1 and the filtering process 2 differ in terms of the filtering degree. Note that although three signals of different frequency configuration are used in this example, the number of signals is not limited to three, and other signals with different degrees of filtering could also be determined, with position measurements then being performed using 4 or more signals.

The filtering process can be divided into those cases where low pass filtering is performed and those cases where high pass filtering is performed. In those cases where low pass filtering is performed, position measurements are carried out using a position measurement method such as that shown in FIG. 7 (edge measurement method, correlation method), or a correlation method as described in FIG. 11 (template matching or a folded autocorrelation method). In contrast, in those cases where high pass filtering is performed as the filtering process, position measurements are carried out using a correlation method as described in FIG. 7 or FIG. 11.

At step S23, differences are determined between each of the plurality of mark position information determined at step S22.

At step S24, a judgment is made as to whether or not these differences exceed a preset tolerance (a predetermined value). If all of the differences exceed the tolerance the process proceeds to step S25, whereas if the difference from some combinations does not exceed the tolerance the process progresses to step S26.

At step S25, the mark position information measured for the signal incorporating the largest proportion of low frequency component is selected from amongst the plurality of mark position information determined at step S22. Subsequently, the process progresses to step S37, and alignment operations (the positioning of the wafer W, and the alignment of the reticle R and the wafer W) are carried out based on this selected mark position information.

In contrast, at step S26, a group is extracted comprising the plurality of mark position information for which the difference was less than the tolerance. If there are 4 or more signals for which position information has been determined, and moreover there are a plurality of groups of position information for which the difference is less than the tolerance, then the group comprising the mark position information for the signal incorporating the largest proportion of low frequency component is extracted.

At step S27, a single mark position information is determined based on the plurality of elements (each mark position information) within the extracted group. The method for making this determination could be either of the following two methods. A first determination method is a method wherein the mark position information measured based on the signal incorporating the largest proportion of high frequency component is selected from amongst the plurality of elements, and set as the mark position information X. A second determination method is a method wherein the mark position information X is calculated, using a technique such as that outlined in FIG. 7 (step S23) or FIG. 11 (step S24) for compensating for mark asymmetry. Subsequently, the process proceeds to step S37, and alignment operations (the positioning of the wafer W, and the alignment of the reticle R and the wafer W) are carried out based on the mark position information X determined by either of the above two methods.

Whether the first determination method or the second determination method is selected may be left to the selection choice of the operator, or alternatively may be selected automatically by the apparatus in accordance with factors such as the wafer process, or the shape of the mark. For example, if the mark shape and the process possess characteristics which suggest that asymmetry is likely to occur in the mark signal then the second determination method could be selected, with the first determination method being selected in cases where asymmetry is unlikely.

The description above outlines the process operations for the mode process 1.

Next is a description of the mode process 2.

At step S28, position measurements are performed for the original signal, and a signal produced by applying a predetermined filtering process to the original signal. In those cases where low pass filtering is performed as the filtering process, position measurements are carried out using a position measurement method such as that shown in FIG. 7 (edge measurement method, correlation method), or a correlation method as described in FIG. 11 (template matching or a folded autocorrelation method). In contrast, in those cases where high pass filtering is performed as the filtering process, position measurements are carried out using a correlation method as described in FIG. 7 or FIG. 11.

At step S29, the difference between the two sets of mark position information determined at step S28 is determined, and a judgment is made as to whether or not the difference exceeds a preset tolerance (a predetermined value). If the difference exceeds the tolerance the process proceeds to step S30, whereas if the difference does not exceed the tolerance the process progresses to step S31.

At step S30, the mark position information measured for the signal incorporating the larger proportion of low frequency component is selected from amongst the mark position information determined at step S28. In other words, in the case where low pass filtering is performed at step S22, the mark position information measured for the signal which has undergone low pass filtering is selected. In contrast, in the case where high pass filtering is performed at step S22, the mark position information measured based on the signal which has not undergone high pass filtering (namely, the original signal) is selected. The selected mark position information is then set as the mark position information X, and the process proceeds to step S37.

In contrast, at step S31 the mark position information measured for the signal incorporating the larger proportion of high frequency component is selected from amongst the mark position information determined at step S28. In other words, in the case where low pass filtering is performed at step S22, the mark position information measured for the signal which has not undergone low pass filtering (namely, the original signal) is selected. In contrast, in the case where high pass filtering is performed at step S22, the mark position information measured based on the signal which has undergone high pass filtering is selected. The selected mark position information is then set as the mark position information X, and the process proceeds to step S37.

At step S37, the alignment processing outlined above is carried out based on the mark position information X.

The description above outlines the process operations for the mode process 2.

Next is a description of the mode process 3.

At step S32, a position measurement is performed using the original signal. The position measurement is carried out using a position measurement method such as that shown in FIG. 7 (edge measurement method, correlation method), or a correlation method as described in FIG. 11 (template matching or a folded autocorrelation method).

At step S33, mark design value information (for example, in the case of a line and space mark, information such as the total length of the mark in the measurement direction, the spacing between lines, and the spacing between spaces) stored in the memory of the exposure apparatus (alignment device) is compared with the measurement result from step S32.

At step S34, a judgment is made as to whether or not the measurement result is normal, based on the result of the comparison at step S33. The measurement result is considered normal if it falls within a predetermined tolerance relative to the design value information, and considered abnormal if it exceeds this tolerance. If the result is normal the process proceeds to step S35, whereas if the result is abnormal the process proceeds to step S36.

At step S35, the measurement result (mark position information) judged to be normal at step S34 is set as the mark position information X, and the process subsequently progresses to step S37.

In contrast, at step S36, low pass filtering is performed on the original signal and the position measurement is repeated. The process subsequently returns to step S33, where the measurement result using the filtered signal is compared with the mark design value information. Then, if the measurement result is normal the process proceeds to step S35, whereas if the result is abnormal the low pass degree is altered (the low pass index is altered so as to increase the proportion of the low frequency component within the signal), low pass filtering is carried out again, and the position measurement performed yet again. This process is repeated until a normal judgment is produced at step S34.

Subsequently, at step S37, the alignment processing outlined above is carried out based on the mark position information X.

The description above outlines the process operations for the mode process 3.

[Evaluation of the Reliability of a Mark]

Figure 19A:
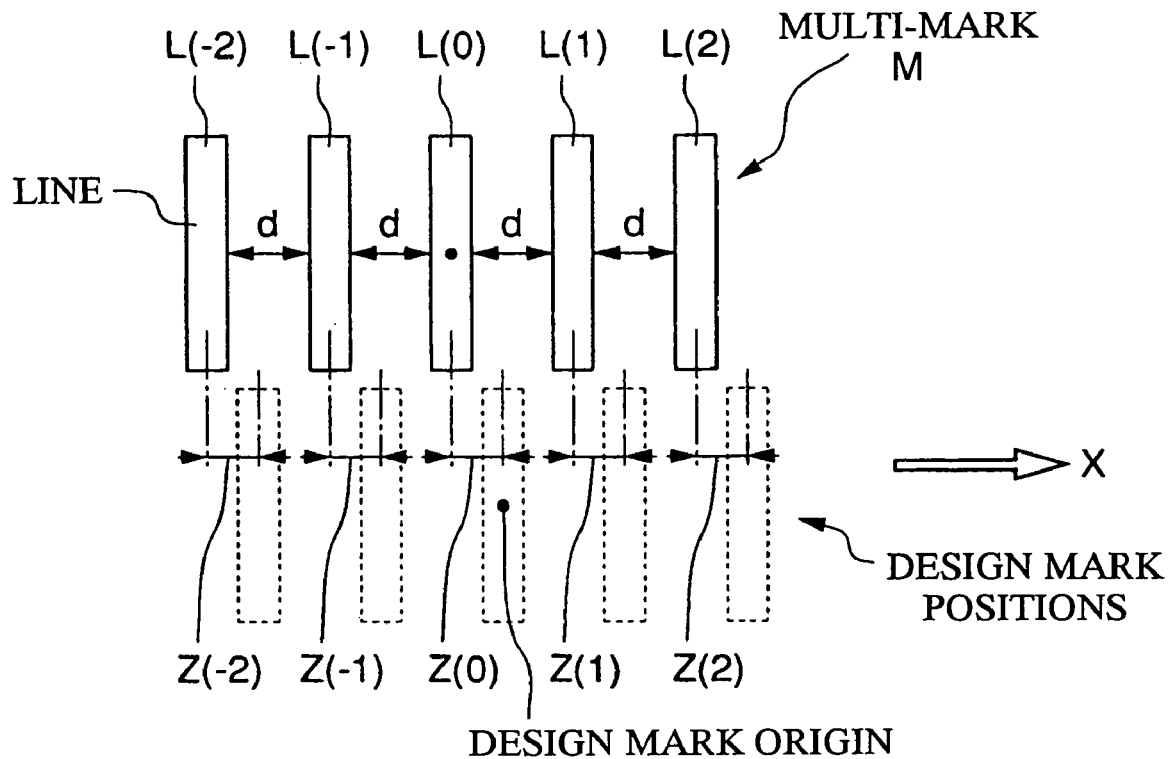
FIG. 19A is a plan view of a symmetrically formed 5 line multi-mark.

In those cases where a multi-mark M (a mark which incorporates at least a plurality of line sections L in a line and space mark, with the edges of adjacent lines seperated by d) such as that shown in FIG. 15 or FIG. 19A is used as an alignment mark, typically the average position of each of the lines $L(n)$ (the multi-mark M shown in FIG. 19A comprises five line sections L, with n=−2, −1, 0, 1, 2) is calculated as the final position of the alignment mark.

In the case of a multi-mark measurement, by applying the thinking outlined above (namely, using the variation in the results calculated based on a series of signals with different frequency configurations, in other words, utilizing the variation in mark position information), a more accurate multi-mark position measurement can be conducted.

First, from the original signal of a multi-mark signal, the position of each line $L(n)$ is measured.

Next, the position of each line $L(n)$ is measured from a low pass signal generated by low pass filtering of the original signal.

Next, each of the line positions obtained from the original signal, and each of the line positions obtained from the low pass signal are compared, and the reliability of each line $L(n)$ evaluated based on the difference between the two measurements. Specifically, for each line, the difference between the two cases (the line positions obtained from the original signal and from the low pass signal) is determined, and the size of that difference determines the reliability, or the weighting $W(n)$. Lines with large differences will have smaller weightings.

Based on these weightings $W(n)$, a weighted mean calculation is performed for each line position (each of the line positions determined from the target signal for measurement, for example the original signal), and the result of this calculation is used as the position of the multi-mark M. Specifically, the position $XLM(n)$ in the X direction of each line measured based on the target signal for measurement is subjected to a weighted mean calculation represented by the following formula, using the weighting $W(n)$ calculated for each line.

$$XMp = \{\Sigma XLM(n) \times W(n)\}/5$$

The location XMp calculated in this manner can then be used as the position of the multi-mark M shown in FIG. 19A.

However, the multi-mark M shown in FIG. 19A is formed symmetrically about a central line $L(0)$, and the multi-mark origin is the line $L(0)$. Consequently, the calculation of the central position of a plurality of lines by using an average calculation for each line position was equivalent to calculating the position of the multi-mark origin, and so the position information XMp determined by a weighted mean calculation was able to be used directly as the position information for the multi-mark M.

Figure 19B:
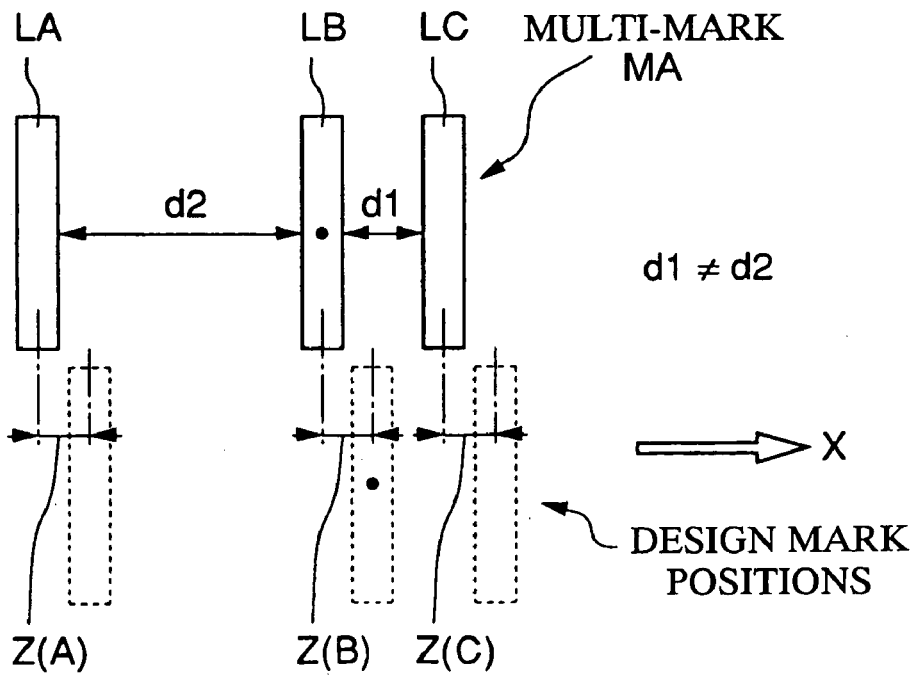
FIG. 19B is a plan view of a 3 line multi-mark which is not formed symmetrically.

However, in the case where measurements are performed on a multi-mark MA such as the mark shown in FIG. 19B, which is not formed symmetrically (the central position of the multi-mark MA does not coincide with the origin of the multi-mark MA), the origin position of the multi-mark cannot be determined by simply performing a weighted mean calculation of the measured values. In the FIG. 19B multi-mark MA, the edges of lines LA and LB are separated by d2, whereas the edges of lines LB and LC are separated by d1 (d1≠d2).

A technique which can be applied to the measurement of the multi-mark MA shown in FIG. 19B, and of course also applied to the multi-mark M shown in FIG. 19A, is described below. In short, if the amount by which the measured multi-mark position (origin position) deviates from the design position (origin position) is known, then by adding that deviation amount to the design value (origin position) of the multi-mark the measured multi-mark position can be determined, and so this degree of deviation needs to be known. The design position information (such as the position information of each line) relating to the multi-mark M is stored in a memory section (not shown in the figure) of the alignment control system 19 or the main control system 15 shown in FIG. 1.

If each line position (measured value) measured based on the target signal for measurement is termed $XLM(n)$, the design position (design value) for each line is termed $XLD(n)$, and the deviation amount between the measured value $XLM(n)$ and the design value $XLD(n)$ is termed $Z(n)$, then the relationship $XLM(n)=XLD(n)+Z(n)$ is satisfied.

In the case where a weighted mean calculation is performed on each of the measured line positions $XLM(n)$ using a weighting $W(n)$, the position of each line becomes $XLM(n) \times W(n)$. In other words, each line position becomes $XLD(n) \times W(n) + Z(n) \times W(n)$.

The weighted mean value XMp of each line position becomes $$XMp = \{\Sigma XLM(n) \times W(n)\}/N$$
$$= \{\Sigma XLD(n) \times W(n)\}/N + \{\Sigma Z(n) \times W(n)\}/N$$

N is the number of lines in the multi-mark, and in the case of FIG. 19A N=5, whereas in the case of FIG. 19B, N=3.

The value which needs to be determined at this point is the weighted deviation amount ($\{\Sigma Z(n) \times W(n)\}/N$), and so if the weighted mean value of the design value of each line is subtracted from the weighted mean value XMp of the measured value of each line, then the deviation amount can be determined. In other words, the deviation amount Z can be determined by the equation $$Z = XMp - \{\Sigma XLD(n) \times W(n)\}/N$$

This calculated value for the deviation amount Z can be used, as is, in subsequent processing (for example, alignment processing), or if the position of the multi-mark needs to be calculated, then by adding the deviation amount Z to the design mark origin position (the design position of the line L(0) in the case of FIG. 19A, or the design position of the line LB in the case of FIG. 19B), the position of the multi-mark can be determined.

In addition to the calculation technique described above, the deviation amount Z can also be determined by determining the deviation amount Z(n) between the measured value XLM(n) and the design value XLD(n) for each line, and then performing a weighted mean calculation on these values of Z(n)(in FIG. 19B. Z(A), ZB and Z(C)).

$$Z = \Sigma\{Z(n) \times W(n)\}/N$$
$$= \{\Sigma\{XLM(n) - XLD(n)\} \times W(n)\}/N$$

In the above description, when the aforementioned weighted mean position XMp of the multi-mark M was calculated, the original signal was used as the target signal for measurement for obtaining the measured value XLM(n) for use in calculating the aforementioned deviation amount Z for the multi-mark M, MA, but the present invention is not restricted to this case. For example, the low pass signal used when determining the weighting W(n) could also be used as the target signal for measurement for obtaining the measured value XLM(n), and a signal which has undergone low pass filtering with another low pass index could also be used as the target signal for measurement. The target signal for measurement used in obtaining the measured value XLM(n) can utilize any signal, provided the signal is from the same mark.

Moreover, in the above description, all of the lines were used for performing the weighted mean calculation, but a system could also be used wherein, for example, those lines for which the difference between the line position obtained form the original signal and the line position obtained from a low pass signal exceeds a predetermined tolerance are not used (are ignored) in the final multi-mark position determination.

By applying the above thinking to known EGA calculations, higher precision superposition exposure can be realized. Namely, for the alignment mark (multi-mark) attached to each respective sample shot (EGA measurement shot), the reliability could be evaluated using the techniques described above, the position information for each alignment mark could then be determined by a weighted mean, and EGA calculations then performed using this position information determined for each sample shot alignment mark.

Furthermore, when EGA calculations are conducted using the position information of each alignment mark (multi-mark), the weighting could be reduced for multi-mark position information incorporating large numbers of lines with low reliability, before performing the EGA calculations. The weighting used in this case could be determined in accordance with the number of low reliability lines incorporated within the multi-mark, and the degree of that unreliability.

The aforementioned evaluation of multi-mark reliability used a comparison between the measurement result from the original signal and the measurement result from a low pass signal, but the present invention is not restricted to this particular case. Measurement results from signals which have undergone filtering with different low pass index values could also be compared, or signals which have been subjected to high pass filtering, or signals which have undergone both low pass and high pass filtering could also be used for the comparison. The position measurements are performed using the techniques outlined above, depending on the nature of the filtering.

In an embodiment of the type described above, the method for compensating for asymmetry in the mark signal comprises determining the difference between the results (mark position information) obtained from a plurality of target signals for measurement (for example, signals which have undergone filtering processing with differing filtering frequencies), and then correcting the measured results using an amount based on this difference (the difference multiplied by a certain coefficient). However, in terms of techniques for compensating for positional deviation resulting from asymmetry within the mark signal, provided the technique utilizes a linear combination of the results obtained from the plurality of target signals for measurement, then the present invention is not limited to the aforementioned type of technique where the difference between each measured value is determined.

Finally, the filters used during the various filtering processes described above will be summarized.

Figure 20A:
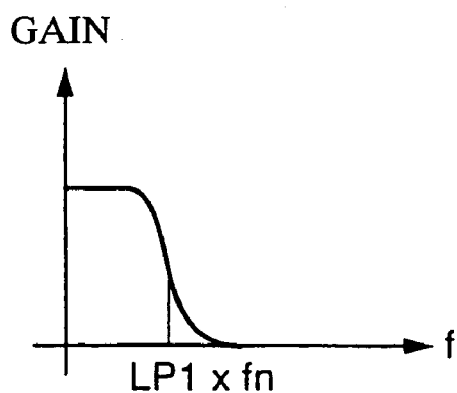
FIG. 20A and FIG. 20B are diagrams showing the frequency characteristics of low pass filters with different low pass indexes.
Figure 20B:
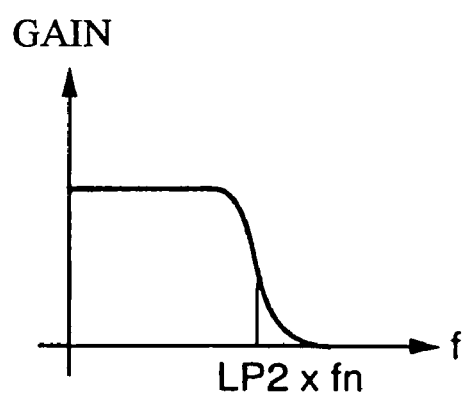
Figure 20C:
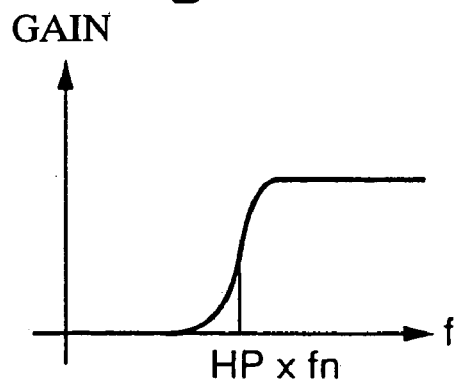
FIG. 20C is a diagram showing the frequency characteristics of a high pass filter.
Figure 20D:
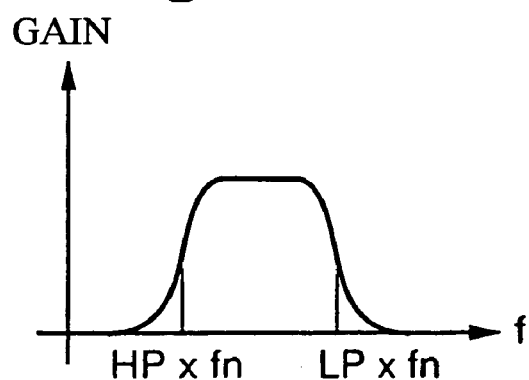
FIG. 20D is a diagram showing the frequency characteristics of a band pass filter.
Figure 20E:
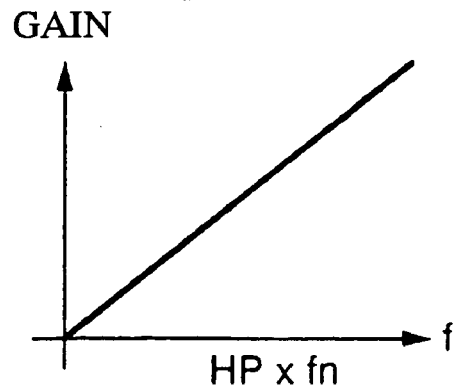
FIG. 20E is a diagram showing the frequency characteristics of a differential filter.
Figure 20F:
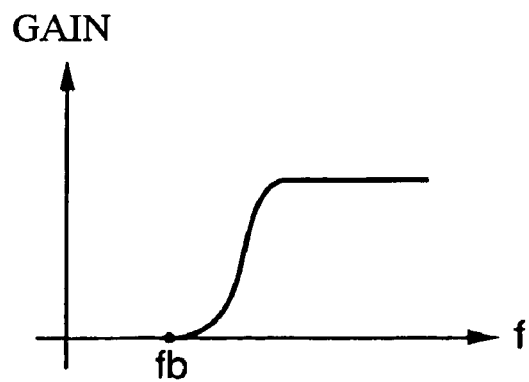
FIG. 20F is a diagram showing the frequency characteristics of a high pass filter.

FIG. 20A to FIG. 20F are diagrams showing the frequency characteristics of the various filters described above, wherein FIG. 20A and FIG. 20B represent low pass filters with different low pass index values, FIG. 20C and FIG. 20F represent high pass filters, FIG. 20D represent a band pass filter, and FIG. 20E represents a differential filter.

FIG. 20A is a diagram showing an example of the gain characteristics of a low pass filter 1 with a low pass index LP1. If the Nyquist frequency determined by the sampling pitch during measurement of the mark signal is termed fn (fn=½×SP, where SP is the sampling pitch during measurement), then this low pass filter 1 causes an alteration in the gain characteristics with a limit specified by the frequency LP1×fn. In other words, if a measured signal is subjected to filtering using this low pass filter 1, then the gain within the measurement signal of the frequency component less than the frequency LP1×fn will increase (namely, the proportion within the signal of the frequency component less than LP1×fn will increase), and the gain within the measurement signal of the frequency component greater than the frequency LP1×fn will decrease (namely, the proportion within the signal of the frequency component greater than LP1×fn will decrease).

FIG. 20B is a diagram showing an example of the gain characteristics of a low pass filter 2 with a low pass index LP2. This low pass filter 2 causes an alteration in the gain characteristics with a limit specified by the frequency LP2×fn. Consequently, if a measured signal is subjected to filtering using this low pass filter 2, then the gain within the measurement signal of the frequency component less than the frequency LP2×fn will increase, and the gain within the measurement signal of the frequency component greater than the frequency LP2×fn will decrease.

FIG. 20C is a diagram showing an example of the gain characteristics of a high pass filter with a high pass index HP. This high pass filter causes an alteration in the gain characteristics with a limit specified by the frequency HP×fn. Consequently, if a measured signal is subjected to filtering using this high pass filter, then the gain within the measurement signal of the frequency component greater than the frequency HP×fn will increase, and the gain within the measurement signal of the frequency component less than the frequency HP×fn will decrease.

FIG. 20D is a diagram showing an example of the gain characteristics of a band pass filter with a low pass index LP and a high pass index HP. This high pass filter causes an alteration in the gain characteristics with limits specified by the frequencies HP×fn and LP×fn. Consequently, if a measured signal is subjected to filtering using this band pass filter, then the gain within the measurement signal of the frequency component within the frequency range HP×fn to LP×fn will increase, and the gain within the measurement signal of the remaining frequency component will decrease.

FIG. 20E is a diagram showing the gain characteristics of a differential filter. A differential filter is a filter which performs a convolution on a measurement signal using a filter such as (−1, 0, 1) for example, and in the case of the example shown, has the effect of increasing the gain as the frequency increases. Consequently, a differential filter has a similar effect to the high pass filter described in FIG. 20C, namely the effect of increasing the gain of the high frequency component of the measurement signal by a greater amount than the gain of the low frequency component.

FIG. 20F is a diagram showing an example of the gain characteristics of a high pass filter which produces a relative gain increase for the frequency component greater than a basic frequency of the mark. This filter functions so as to reduce the gain of a basic frequency fb (described below) of the measurement target mark to a level lower than the gain of a frequency greater than this basic frequency (for example, a frequency more than n times that of the basic frequency, where n is an integer of two or more). If a measured signal is subjected to filtering using the high pass filter of FIG. 20F, then the gain within the measurement signal of the frequency component greater than the frequency fb will increase, and the gain within the measurement signal of the frequency component less than the frequency fb will decrease.

As follows is a description of the basic frequency fb. The basic frequency fb of a mark differs depending on the shape of the mark. The basic frequency fb(m) for a multi-mark as shown in FIG. 5 and FIG. 19A is fb(m)=1/MP, where MP is the mark pitch (for example in FIG. 19A, the spacing from the left edge of the line L(0) to the left edge of the line L(1)). In contrast, the basic frequency fb(s) for a single mark (a mark which rather than the plurality of lines L(n) shown in FIG. 19A, has only a single line) is fb(s)=½MW, where MW is the line width (for example, the distance from the left edge to the right edge of the line L(0) in FIG. 19A). Consequently, if the filter of FIG. 20F is applied to a multi-mark, then the gain of the frequency component less than the frequency 1/MP will be reduced, whereas if applied to a single mark, the gain of the frequency component less than the frequency ½MW will be reduced.

In a position measuring device and a position measurement method, as well as an exposure apparatus and an exposure method according to the present embodiment, even if the mark signal of the measurement target possesses asymmetry, then with any one of the alignment systems including LSA systems, FIA systems and LIA systems, the positional deviation resulting from asymmetry can be detected using either different frequency components or diffracted light beams of different orders, and by correcting for this deviation the effect that the image asymmetry has on the measurement can be reduced, and so a more accurate high precision alignment can be performed. As a result, there is no requirement to increase the NA of the detection optical system, nor to prepare a special short wavelength light source, meaning increases in the size and cost of the apparatus can also be prevented.

Moreover, it is preferable that the aforementioned correction calculation method and correction coefficient R are optimized by simulation based on the structure (the design value information for the mark) of the target object for detection (the detection mark), or alternatively optimized based on the raw signals (the frequency configuration of the image signal, or the frequency band used from the image signal) obtained from the mark detection device. In addition, in order to achieve the best superposition results, it is preferable that the values and the techniques associated with the correction calculation method and the correction coefficient R are optimized.

Furthermore, the position measurement device and the position measurement method of the present invention can also be used for a superposition measurement device for measuring the superposition error of marks formed on each layer on a wafer W. In such a case, two marks for measurement appear within the same screen, and these marks could either be processed simultaneously, and the relative positions of the marks calculated and corrected for each frequency or for each order of diffracted light, or alternatively the two marks could be measured and corrected separately using the position measurement method of the present invention, and the relative positions of the two marks then measured and corrected.

Examples of suitable materials which can be used as the substrate of the present embodiment include glass plates used for liquid crystal display devices, semiconductor wafers used for semiconductor devices, ceramic wafers used for thin film magnetic heads, or the mask or reticle original plates (synthetic quartz, silicon wafers) used in exposure apparatus.

The exposure apparatus 1 can be applied to step and repeat type exposure apparatus (repeaters) where the pattern of the reticle R is exposed with the reticle R and the wafer W in a stationary state, and the wafer W is then moved through a series of sequential steps, as well as to scanning projection exposure apparatus (U.S. Pat. No. 5,473,410) using a step and scan system, so-called scanning steppers, where the reticle R and the wafer W are moved synchronously while the pattern of the reticle R is exposed. Furthermore, the exposure apparatus 1 can also be applied to a proximity exposure apparatus where a projection optical system 9 is not used, but rather the reticle R and the wafer W are brought into close proximity and the pattern of the reticle R is then exposed onto the wafer W.

The exposure apparatus 1 is not limited to use as an exposure apparatus for semiconductor manufacture, but rather can be used in a wide range of applications including use as a liquid crystal exposure apparatus for exposing a liquid crystal display element pattern onto a square glass plate, or use as the exposure apparatus for manufacturing thin film magnetic heads, imaging elements (CCD) or masks M.

Furthermore, the light source 2 (exposure light and alignment light) can utilize emission lines from an extra high pressure mercury lamp (g line (436 nm), i line (365 nm)), a KrF excimer laser (248 nm), an ArF excimer laser (193 nm), or a $F_2$ laser (157 nm), as well as charged particle beams such as X-rays or electron gun beams. For example, in the case where an electron beam is used, thermionic emission type lanthanum hexaboride or tantalum could be used as the electron gun.

The magnification of the projection optical system 9 may be a reduction system, an equal (1:1) system, or a magnification system. In terms of the projection optical system 9, in those cases where far ultraviolet light such as an excimer laser is used, the glass material should use a material such as quartz or fluorite which transmits far ultraviolet rays, in those cases where a $F_2$ laser is used, the optical system should use a catadioptric system or a dioptric system (with the reticle R also being a reflective type reticle), and furthermore in those cases where an electron beam is used, the optical system should utilize an electron optical system comprising an electron lens and a polariscope. Needless to say, the transmission path along which the electron beam passes should be in a state of vacuum.

A semiconductor device is manufactured through a series of steps such as a step for designing the functions and performance of each device, a step for producing a reticle R based on this design step, a step for producing a wafer W from silicon material, a step for using an exposure apparatus 1 of the embodiment described above to expose the pattern of the reticle R onto the wafer W, a step for assembling each of the devices (dicing process, bonding process, packaging process), and an inspection step.

INDUSTRIAL APPLICABILITY

The present invention relates to an exposure apparatus and an exposure method for projection exposure of a photomask pattern image onto a photosensitive substrate, and a position measuring device and a position measurement method for measuring the exposure position and the drawing accuracy of the aforementioned photomask, as well as to a superposition measuring device and a superposition measurement method for measuring the superposition error of the exposed pattern, all within a manufacturing process for a semiconductor element or a liquid crystal display element or the like.

A position measuring device and a position measurement method of the present invention are configured so as to correct a calculation result from a calculation unit based on the asymmetry of a mark signal. In this position measuring device and position measurement method, even if the mark signal possesses asymmetry, then with any one of the alignment systems including LSA systems, FIA systems and LIA systems, by detecting the positional deviation resulting from asymmetry and then correcting for this deviation, the effect that the image asymmetry has on the measurement can be reduced, and so a more accurate high precision alignment can be performed, and there is no requirement to increase the NA of the detection optical system, nor to prepare a special short wavelength light source, and increases in the size and cost of the apparatus can also be prevented.

Furthermore, an exposure apparatus of the present invention is provided with a position measuring device according to any one of the first through fifth aspects, the seventh through tenth aspects, the twelfth through seventeenth aspects, the nineteenth through twenty fourth aspects, and the twenty sixth through twenty eighth aspects of the invention as a position measuring device which measures the position of at least one of the mask mark and the substrate mark, and an exposure method of the present invention utilizes a position measuring method according to any one of the thirty second through thirty seventh aspects, the thirty ninth through forty third aspects, the forty fifth through fiftieth aspects, and the fifty second through fifty third aspects of the invention as a measuring method for measuring the position of at least one of the mask mark and the substrate mark. With the exposure apparatus and the exposure method of the present invention, a high precision alignment is able to be realized when the mask and the substrate are positioned, or when the substrate is positioned relative to a previous layer.

In addition, a superposition measuring device of the present invention is provided with a position measuring device according to any one of the first through fifth aspects, the seventh through tenth aspects, the twelfth through seventeenth aspects, the nineteenth through twenty fourth aspects, and the twenty sixth through twenty eighth aspects of the invention as a position measuring device which measures the positions of mark positions, and a superposition measurement method of the present invention utilizes a position measurement method according to any one of the thirty second through thirty seventh aspects, the thirty ninth through forty third aspects, the forty fifth through fiftieth aspects, and the fifty second through fifty third aspects of the invention as a position measurement method for measuring the position of a mark position. With the superposition measuring device and the superposition measurement method of the present invention, positional deviation resulting from mark signal asymmetry can be corrected, and highly accurate superposition error measurements can be performed.

The invention claimed is:

1. A position measuring device comprising a calculation unit which calculates mark position information relating to a position of a mark by using a mark signal obtained by irradiating a detection beam onto the mark formed on an object, wherein the calculation unit includes a processing unit which performs predetermined processing on predetermined information to be used when calculating the mark position information, and generates a plurality of processing information, and the position measuring device further comprises a correction unit which is electrically connected to the calculation unit and corrects calculation results from the calculation unit based on a difference between a plurality of the mark position information calculated by the calculation unit using the plurality of processing information, wherein of the plurality of mark position information, if a first position information is termed CH, a second position information is termed CL, and a predetermined coefficient is termed R (R>0), the first position information CH is calculated from a higher resolution signal than the second position information CL, and the correction unit performs corrections based on a result determined by (CL−CH)×R.

2. A position measuring device according to claim 1, wherein the predetermined information is the mark signal, the processing unit performs processing on the mark signal and alters a proportion within the mark signal of a frequency component of a predetermined frequency range, and generates a mark signal having a different frequency configuration from the mark signal, and the correction unit performs the corrections based on a plurality of mark signal information calculated by the calculation unit using a plurality of mark signals.

3. A position measuring device according to claim 2, wherein the processing unit performs alteration processing of a frequency configuration of the mark signal using a predetermined frequency gain distribution.

4. A position measuring device according to claim 2, wherein the calculation unit calculates the plurality of mark position information by either one of performing a reflective autocorrelation for each of the plurality of mark signals having different frequency configurations, and performing template matching of the plurality of mark signals using a template having a predetermined frequency configuration.

5. A position measuring device according to claim 2, wherein the processing unit generates a plurality of mark signals having different frequency configurations by in addition to the processing on the mark signal for altering a proportion within the mark signal of the frequency component of the predetermined range, also performing processing which alters a proportion, within the mark signal, of a frequency component of a range for which at least a portion thereof differs from the predetermined range.

6. A position measuring device according to claim 1, wherein
the predetermined information is the mark signal,
the processing unit calculates a phase of each different frequency component of the mark signal, and
the correction unit performs the corrections based on a plurality of mark position information calculated from a plurality of phases.

7. A position measuring device according to claim 6, wherein
the processing unit performs a Fourier transformation on the mark signal and calculates phases of Fourier components of different order, and
the correction unit performs the corrections based on the plurality of mark position information calculated from phases of the Fourier components of different order.

8. A position measuring device according to claim 1, wherein
the calculation unit calculates the plurality of mark position information by performing template matching on the mark signal using a template having a predetermined frequency configuration,
the predetermined information is either one of a correlation function calculated from the template and the mark signal, and the template,
the processing unit performs processing which alters a proportion of a frequency component of a predetermined frequency range for either one of the template and the correlation function, and generates either one of a plurality of templates with different frequency configurations and a plurality of correlation functions, and
the correction unit performs the corrections based on a plurality of mark position information calculated by the calculation unit using either one of the plurality of templates and the plurality of correlation functions.

9. A position measuring device according to claim 1, wherein the higher resolution signal incorporates a higher frequency component than a frequency component of a signal used when obtaining the second position information CL.

10. An exposure apparatus which aligns a mask and a substrate by using a mask mark on the mask and a substrate mark on the substrate, and then exposes a pattern of the mask onto the substrate, comprising:
a position measuring device according to claim 1 is provided as a position measuring device which measures a position of at least one of the mask mark and the substrate mark.

11. A superposition measuring device which measures a superposition error between a plurality of measurement targets comprising a plurality of marks formed on individual layers on a substrate, comprising:
a position measuring device according to claim 1 is provided as a position measuring device which measures positions of the marks.

12. A position measuring device comprising a calculation unit which calculates mark position information relating to a position of a mark by using a mark signal obtained by irradiating a detection beam onto the mark formed on an object,
wherein the mark signal includes phases of diffracted light of different orders generated from the mark, and
the position measuring device further comprises a correction unit which is electrically connected to the calculation unit and corrects calculation results from the calculation unit based on a difference between a plurality of the mark position information calculated from a plurality of the phases, wherein
of the plurality of mark position information, if a first position information is termed CH, a second position information is termed CL, and a predetermined coefficient is termed R (R>0),
the first position information CH is calculated from a higher resolution signal than the second position information CL,
the correction unit performs corrections based on a result determined by (CL−CH)×R, and
the higher resolution signal incorporates a higher frequency component than a frequency component of a signal used when obtaining the second position information CL.

13. An exposure apparatus which aligns a mask and a substrate by using a mask mark on the mask and a substrate mark on the substrate, and then exposes a pattern of the mask onto the substrate, comprising:
a position measuring device according to claim 12 is provided as a position measuring device which measures a position of at least one of the mask mark and the substrate mark.

14. A superposition measuring device which measures a superposition error between a plurality of measurement targets comprising a plurality of marks formed on individual layers on a substrate, comprising:
a position measuring device according to claim 12 is provided as a position measuring device which measures positions of the marks.

15. A position measuring device comprising a calculation unit which calculates mark position information relating to a position of a mark formed on an object, by performing template matching between a template having a predetermined frequency configuration and a mark signal obtained by irradiating a detection beam onto the mark, wherein the position measuring device further comprises:
a filtering unit which performs either one of a first filtering process which reduces a proportion within the mark signal of a frequency component less than a specified frequency and reduces a proportion within the template of a frequency component less than the specified frequency, and a second filtering process which reduces a proportion of a frequency component less than the specified frequency on a correlation function calculated from the template and the mark signal, and the calculation unit is electrically connected to the filtering unit and calculates the mark position information by either one of performing template matching on the mark signal and the template which have been subjected to the first filtering process, and basing calculations on correlation function which has been subjected to the second filtering process, wherein the filtering unit reduces a proportion of a frequency component within the mark signal having a basic frequency defined based on a shape of the mark, less than a proportion of a frequency component within the mark signal having a frequency greater than the basic frequency.

16. A position measuring device according to claim 15, wherein the basic frequency in a multi-mark incorporating a plurality of line patterns is 1/MP, where MP refers to a mark pitch showing a spacing between each line pattern, and the basic frequency in a single mark made up of only a single line pattern is ½MW, where MW refers to a width of the single line pattern.

17. An exposure apparatus which aligns a mask and a substrate by using a mask mark on the mask and a substrate mark on the substrate, and then exposes a pattern of the mask onto the substrate, comprising:
a position measuring device according to claim 15 is provided as a position measuring device which measures a position of at least one of the mask mark and the substrate mark.

18. A superposition measuring device which measures a superposition error between a plurality of measurement targets comprising a plurality of marks formed on individual layers on a substrate, comprising:
a position measuring device according to claim 15 is provided as a position measuring device which measures positions of the marks.

19. A position measuring device comprising a calculation unit which calculates mark position information relating to a position of a mark formed on an object, by performing folded autocorrelation of a mark signal obtained by irradiating a detection beam onto the mark, wherein the position measuring device further comprises:
a filtering unit which performs filtering processing that reduces a proportion within the mark signal of a frequency component less than a specified frequency, and the calculation unit is electrically connected to the filtering unit and calculates the mark position information by performing a folded autocorrelation of the mark signal which has undergone the filtering processing, wherein the filtering unit reduces a proportion of a frequency component within the mark signal having a basic frequency defined based on a shape of the mark, less than a proportion of a frequency component within the mark signal having a frequency greater than the basic frequency.

20. An exposure apparatus which aligns a mask and a substrate by using a mask mark on the mask and a substrate mark on the substrate, and then exposes a pattern of the mask onto the substrate, comprising:
a position measuring device according to claim 19 is provided as a position measuring device which measures a position of at least one of the mask mark and the substrate mark.

21. A superposition measuring device which measures a superposition error between a plurality of measurement targets comprising a plurality of marks formed on individual layers on a substrate, comprising:
a position measuring device according to claim 19 is provided as a position measuring device which measures positions of the marks.

22. A position measuring device comprising a calculation unit which calculates mark position information relating to a position of a mark by using a mark signal obtained by irradiating a detection beam onto the mark formed on an object, wherein the position measuring device further comprises:
a filtering unit which performs filtering processing of the mark signal, and generating a plurality of mark signals having different frequency configurations, and an extraction unit which is electrically connected to the filtering unit and extracts, from a plurality of mark position information calculated by the calculation unit using the plurality of mark signals, mark position information satisfying a predetermined condition, and a final mark position information is determined based on the extracted mark position information, wherein the extraction unit extracts mark position information calculated based on a mark signal incorporating a larger low frequency component if a difference between the plurality of mark position information is greater than a predetermined value, and extracts mark position information calculated based on a mark signal incorporating a larger high frequency component if the difference is less than or equal to the predetermined value.

23. An exposure apparatus which aligns a mask and a substrate by using a mask mark on the mask and a substrate mark on the substrate, and then exposes a pattern of the mask onto the substrate, comprising:
a position measuring device according to claim 22 is provided as a position measuring device which measures a position of at least one of the mask mark and the substrate mark.

24. A superposition measuring device which measures a superposition error between a plurality of measurement targets comprising a plurality of marks formed on individual layers on a substrate, comprising:
a position measuring device according to claim 22 is provided as a position measuring device which measures positions of the marks.

25. A position measuring device comprising a calculation unit which calculates mark position information relating to a position of a mark by using a mark signal obtained by irradiating a detection beam onto the mark formed on an object, wherein the position measuring device further comprises:
a filtering unit which performs filtering processing of the mark signal, and generating a plurality of mark signals having different frequency configurations, and an extraction unit which is electrically connected to the filtering unit and extracts, from a plurality of mark position information calculated by the calculation unit using the plurality of mark signals, mark position information satisfying a predetermined condition, and a final mark position information is determined based on the extracted mark position information, wherein the filtering unit reduces a proportion within the mark signal of a frequency component greater than a specified frequency, and in a case where the filtering processing is performed a plurality of times on the mark signal, the filtering is performed following an alteration of the frequency component for which a proportion is to be reduced.

26. A position measuring method comprising a calculation step which calculates mark position information relating to a position of a mark by using a mark signal obtained by irradiating a detection beam onto the mark formed on an object,
   wherein the calculation step performs predetermined processing on predetermined information to be used when calculating the mark position information, and generates a plurality of processing information, and
   the position measuring method further includes correcting calculation results from the calculation step based on a difference between a plurality of the mark position information calculated by the calculation step using the plurality of processing information, wherein
   of the plurality of mark position information, if a first position information is termed CH, a second position information is termed CL, and a predetermined coefficient is termed R (R>0),
   the first position information CH is calculated from a higher resolution signal than the second position information CL, and
   corrections are performed based on a result determined by (CL−CH)×R.

27. A position measuring method according to claim 26, wherein the predetermined information is the mark signal, the position measuring method further comprises:
   performing processing on the mark signal which alters a proportion within the mark signal of a frequency component of a predetermined frequency range, and generates a mark signal having a different frequency configuration from the mark signal, and
   performing the corrections based on a plurality of mark signal information calculated by the calculation step using a plurality of mark signals.

28. A position measuring method according to claim 27, wherein alteration processing of a frequency configuration of the mark signal is performed using a predetermined frequency gain distribution.

29. A position measuring method according to claim 27, further comprising:
   performing a Fourier transformation on the mark signal and calculating phases of Fourier components of different order, and
   performing the corrections based on the plurality of mark position information calculated from phases of the Fourier components of different order.

30. An exposure method which aligns a mask and a substrate by using a mask mark on the mask and a substrate mark on the substrate, and then exposes a pattern of the mask onto the substrate, including:
   a position measuring method according to claim 26 as a position measuring method which measures a position of at least one of the mask mark and the substrate mark.

31. A superposition measuring method which measures a superposition error between a plurality of measurement targets comprising a plurality of marks formed on individual layers on a substrate, comprising:
   a position measuring method according to claim 26 as a position measuring method which measures positions of the marks.

32. A position measuring method comprising a calculation step which calculates mark position information relating to a position of a mark by using a mark signal obtained by irradiating a detection beam onto the mark formed on an object,
   wherein the mark signal includes phases of diffracted light of different orders generated from the mark, and
   calculation results from the calculation step are corrected based on a difference between a plurality of mark position information calculated from a plurality of phases, wherein
   of the plurality of mark position information, if a first position information is termed CH, a second position information is termed CL, and a predetermined coefficient is termed R (R>0),
   the first position information CH is calculated from a higher resolution signal than the second position information CL, and
   corrections are performed based on a result determined by (CL−CH)×R.

33. An exposure method which aligns a mask and a substrate by using a mask mark on the mask and a substrate mark on the substrate, and then exposes a pattern of the mask onto the substrate, including:
   a position measuring method according to claim 32 as a position measuring method which measures a position of at least one of the mask mark and the substrate mark.

34. A position measuring method using a calculation unit which calculates mark position information relating to a position of a mark formed on an object, by performing template matching between a template having a predetermined frequency configuration and a mark signal obtained by irradiating a detection beam onto the mark, the position measuring method comprising:
   carrying out either one of a first filtering process which reduces a proportion within the mark signal of a frequency component less than a specified frequency and reducing a proportion within the template of a frequency component less than the specified frequency, and a second filtering process which reduces a proportion of a frequency component less than the specified frequency on a correlation function calculated from the template and the mark signal, wherein in the first or second filtering process, within the mark signal, a proportion of a frequency component within the mark signal having a basic frequency defined based on a shape of the mark is reduced even more than a proportion of a frequency component within the mark signal having a frequency greater than the basic frequency, and
   the calculation unit calculates the mark position information by either one of performing template matching on the mark signal and the template which have been subjected to the first filtering process, and basing calculations on the correlation function which has been subjected to the second filtering process.

35. A position measuring method according to claim 34, wherein the basic frequency in a multi-mark incorporating a plurality of line patterns is 1/MP, where MP refers to a mark pitch showing a spacing between each line pattern, and the basic frequency in a single mark made up of only a single line pattern is ½MW, where MW refers to a width of the single line pattern.

36. An exposure method which aligns a mask and a substrate by using a mask mark on the mask and a substrate mark on the substrate, and then exposes a pattern of the mask onto the substrate, including:
   a position measuring method according to claim 34 as a position measuring method which measures a position of at least one of the mask mark and the substrate mark.

37. A position measuring method using a calculation unit which calculates mark position information relating to a position of a mark formed on an object, by performing folded autocorrelation of a mark signal obtained by irradiating a detection beam onto the mark, the position measuring method comprising:

performing filtering processing which reduces a proportion within the mark signal of a frequency component less than a specified frequency, wherein in the filtering processing, within the mark signal, a proportion of a frequency component within the mark signal having a basic frequency defined based on a shape of the mark is reduced even more than a proportion of a frequency component within the mark signal having a frequency greater than the basic frequency, and the calculation unit calculates the mark position information by performing a folded autocorrelation of the mark signal which has undergone the filtering processing.

38. A position measuring method according to claim 37, wherein the basic frequency in a multi-mark incorporating a plurality of line patterns is 1/MP, where NIP refers to a mark pitch showing a spacing between each line pattern, and the basic frequency in a single mark made up of only a single line pattern is ½MW, where MW refers to a width of the single line pattern.

39. An exposure method which aligns a mask and a substrate by using a mask mark on the mask and a substrate mark on the substrate, and then exposes a pattern of the mask onto the substrate, including:

a position measuring method according to claim 37 as a position measuring method which measures a position of at least one of the mask mark and the substrate mark.

40. A position measuring method using a calculation unit which calculates mark position information relating to a position of a mark by using a mark signal obtained by irradiating a detection beam onto the mark formed on an object, the position measuring method comprising:

performing filtering processing of the mark signal, and generating a plurality of mark signals having different frequency configurations, and extracting, from a plurality of mark position information calculated by the calculation unit using the plurality of mark signals, mark position information satisfying a predetermined condition, and determining a final mark position information based on the extracted mark position information, wherein the filtering processing reduces a proportion within the mark signal of a frequency component greater than a specified frequency, and in a case where the filtering processing is performed a plurality of times on the mark signal, the filtering is performed following an alteration of the frequency component for which a proportion is to be reduced.

41. A position measuring method according to claim 40, further comprising:

extracting mark position information calculated based on a mark signal incorporating a larger low frequency component if a difference between the plurality of mark position information is greater than a predetermined value, and extracting mark position information calculated based on a mark signal incorporating a larger high frequency component if the difference is within the predetermined value.

42. An exposure method which aligns a mask and a substrate by using a mask mark on the mask and a substrate mark on the substrate, and then exposes a pattern of the mask onto the substrate, including:

a position measuring method according to claim 40 as a position measuring method which measures a position of at least one of the mask mark and the substrate mark.

43. A position measuring method using a calculation unit which calculates mark position information relating to a position of a mark by using a mark signal obtained by irradiating a detection beam onto the mark formed on an object, the position measuring method comprising:

comparing mark position information calculated by the calculation unit based on the mark signal and a predetermined design value information relating to the mark, and then judging acceptability of the calculated mark position information, performing filtering processing of the mark signal, and generating a mark processed signal having a different frequency configuration from the mark signal subjected to the filtering processing, and in a case where acceptability of the mark signal is denied by the judgment, calculating the mark position information by the calculation unit using the generated mark processed signal, and judging acceptability of the mark position information, and repeating the filtering processing, the calculating of mark position information based on the mark processed signal, and the judging until acceptability of mark position information calculated by the calculation unit is approved, wherein the filtering processing reduces a proportion within the mark signal of a frequency component greater than a specified frequency, and in a case where the filtering processing is performed a plurality of times on the mark signal, the filtering is performed following an alteration of the frequency component for which a proportion is to be reduced.

44. An exposure method which aligns a mask and a substrate by using a mask mark on the mask and a substrate mark on the substrate, and then exposes a pattern of the mask onto the substrate, including:

a position measuring method according to claim 43 as a position measuring method which measures a position of at least one of the mask mark and the substrate mark.

45. A position measuring method using a calculation unit which calculates mark position information relating to a position of a mark by using a mark signal obtained by irradiating a detection beam onto the mark formed on an object, the position measuring method comprising:

performing filtering processing on the mark signal, and generating a mark signal having a different frequency configuration, comparing a plurality of mark position information calculated by the calculation unit using a plurality of mark signals having different frequency configurations, and evaluating the mark position information, and the calculation unit calculates a final mark position information based on the plurality of mark position information and evaluation results, wherein the filtering processing reduces a proportion within the mark signal of a frequency component greater than a specified frequency, and in a case where the filtering processing is performed a plurality of times on the mark signal, the filtering is performed following an alteration of the frequency component for which a proportion is to be reduced.

46. A position measuring method according to claim 45, wherein the mark is a multi-mark in which a plurality of mark elements are aligned periodically in a predetermined direction, the position measuring method comprising:

evaluating position information of each mark element based on differences between position information of each mark element within the plurality of mark position information, and determining a weighting for position information of each mark element when calculating a final position information using position information of each of the mark elements.

47. A position measuring method according to claim 45, wherein a plurality of marks are formed on the object, the position measuring method comprising:

performing the filtering processing on a plurality of target marks for measurement from amongst the plurality of marks, and generating a mark signal having a different frequency configuration for each of the target marks for measurement, evaluating the mark position information determined for each of the target marks for measurement, and calculating position information for each of the plurality of marks formed on the object by a statistical calculation using evaluation results and the mark position information for each of the target marks for measurement.

48. An exposure method which aligns a mask and a substrate by using a mask mark on the mask and a substrate mark on the substrate, and then exposes a pattern of the mask onto the substrate, including:

a position measuring method according to claim 45 as a position measuring method which measures a position of at least one of the mask mark and the substrate mark.

* * * * *